(12) United States Patent
Rodriguez

(10) Patent No.: US 9,876,454 B2
(45) Date of Patent: *Jan. 23, 2018

(54) CIRCUIT AND METHOD FOR FREQUENCY SYNTHESIS FOR SIGNAL DETECTION IN AUTOMATIC VOLTAGE REGULATION FOR SYNCHRONOUS GENERATORS

(71) Applicant: Alonso Rodriguez, Caracas (VE)

(72) Inventor: Alonso Rodriguez, Caracas (VE)

(73) Assignee: Alonso Rodriguez, Caracas (VE)

( * ) Notice: Subject to any disclaimer, the term of this patent is extended or adjusted under 35 U.S.C. 154(b) by 0 days.

This patent is subject to a terminal disclaimer.

(21) Appl. No.: 15/161,992

(22) Filed: May 23, 2016

(65) Prior Publication Data

US 2016/0268941 A1    Sep. 15, 2016

Related U.S. Application Data

(63) Continuation of application No. 14/274,456, filed on May 9, 2014, now Pat. No. 9,350,281.

(51) Int. Cl.
| | |
|---|---|
| *H02P 9/14* | (2006.01) |
| *H02H 7/06* | (2006.01) |
| *H03K 7/08* | (2006.01) |
| *H02P 9/02* | (2006.01) |
| *H03L 7/08* | (2006.01) |

(52) U.S. Cl.
CPC ............. *H02P 9/14* (2013.01); *H02H 7/067* (2013.01); *H02P 9/02* (2013.01); *H03K 7/08* (2013.01); *H03L 7/08* (2013.01)

(58) Field of Classification Search
CPC ............. H02P 9/14; H03K 7/08; H02H 7/067

USPC ......... 322/17, 19, 20, 28; 318/141, 142, 143
See application file for complete search history.

(56) References Cited

U.S. PATENT DOCUMENTS

| | | | | |
|---|---|---|---|---|
| 3,539,906 A | * | 11/1970 | Habock | H02P 1/46 322/24 |
| 4,106,069 A | * | 8/1978 | Trautner | H02H 7/0805 174/DIG. 17 |

(Continued)

*Primary Examiner* — Viet Nguyen
(74) *Attorney, Agent, or Firm* — Vernon Francissen

(57) ABSTRACT

Automatic voltage regulation is shown involving full wave rectifying a power signal and generating a reference corresponding to an operating voltage level, line sampling the power signal and comparing it to the reference to generate a line sync signal synchronized to the power signal. Producing 90° out of phase signals synchronized to the line sync signal with a PLL locked onto the line sync signal that outputs a phase error signal. Generating a quadrature signal from the phase signals. Sampling the peaks of the rectified power signal using the quadrature signal to produce a control signal. Subtracting the error signal and damping signal from the reference to produce a duty cycle modulation signal. The duty cycle modulation signal controls a duty cycle of a field voltage control signal that oscillates at a predetermined frequency. The field voltage control signal is low-pass filtered to produce the damping signal. The control signal is utilized to detect a short circuit condition and engage a circuit protection device. The reference voltage may also be obtained from another generator so that the output voltage is controlled to operate in sync with the other generator.

2 Claims, 19 Drawing Sheets

(56) References Cited

U.S. PATENT DOCUMENTS

| | | | | |
|---|---|---|---|---|
| 5,453,901 A * | 9/1995 | Lackey | H02P 9/02 | |
| | | | 322/59 | |
| 5,886,417 A * | 3/1999 | Oka | F01D 15/10 | |
| | | | 290/52 | |
| 5,995,391 A * | 11/1999 | Davies | H02J 3/1857 | |
| | | | 323/217 | |
| 7,405,542 B1 * | 7/2008 | McAvoy | H02P 5/747 | |
| | | | 322/14 | |
| 7,755,209 B2 * | 7/2010 | Jones | H02M 5/4585 | |
| | | | 290/44 | |
| 7,923,853 B2 * | 4/2011 | Lewis | F03D 7/0284 | |
| | | | 290/44 | |
| 8,248,038 B2 * | 8/2012 | Padiyar | H02H 7/06 | |
| | | | 322/20 | |
| 8,766,479 B2 * | 7/2014 | Dorn | H02J 3/42 | |
| | | | 290/31 | |
| 2007/0189045 A1 * | 8/2007 | Gritter | H02M 7/53873 | |
| | | | 363/40 | |
| 2009/0108676 A1 * | 4/2009 | Algrain | H02J 3/42 | |
| | | | 307/73 | |
| 2009/0231893 A1 * | 9/2009 | Esmaili | H02M 7/53871 | |
| | | | 363/79 | |
| 2013/0010505 A1 * | 1/2013 | Bo | H02J 3/386 | |
| | | | 363/37 | |
| 2014/0204633 A1 * | 7/2014 | Khajehoddin | H02J 3/383 | |
| | | | 363/40 | |

\* cited by examiner

CH1 = 5.00V/  CH2 = 5.00V/  2.000ms/  50.00kSa/s

CH1 = 5.00V/  CH2 = 5.00V/  2.000ms/  50.00kSa/s

CH1 = 5.00V/    CH2 = 5.00V/    2.000ms/    20.00kSa/s

CH1 = 5.00V/    CH2 = 5.00V/    2.000ms/    50.00kSa/s

CH1 = 1.00V/   CH2 = 50.0V/   10.00ms/   5.00kSa/s

CH1 = 5.00V/   CH2 = 1.00V/   20.00ms/   5.00kSa/s

CIRCUIT AND METHOD FOR FREQUENCY SYNTHESIS FOR SIGNAL DETECTION IN AUTOMATIC VOLTAGE REGULATION FOR SYNCHRONOUS GENERATORS

CROSS-REFERENCE TO RELATED APPLICATIONS

The present application is a continuation of U.S. Utility patent application Ser. No. 14/274,456 for "System and Method for Frequency Synthesis for Signal Detection in Automatic Voltage Regulators for Synchronous Generators," filed May 9, 2014, now U.S. Pat. No. 9,350,281, which is incorporated by reference herein in its entirety for all purposes.

BACKGROUND

The present invention relates to automatic voltage regulation and, more particularly, to voltage control for synchronous generators.

Synchronous generators are generally used to produce alternating current (AC) power, such as the 120 volts AC (VAC) at a frequency of 60 Hertz (Hz) that is the standard in much of North America. Synchronous generators typically feature precise control of voltage, frequency, and power, which is achieved through the use of voltage regulators. FIG. 1 is a simplified circuit diagram illustrating an example of a synchronous generator 10. Synchronous generator 10 is composed of a stationary armature winding, stator 12, with multiple wired connected in series or parallel to obtain a desired voltage for the output voltage $V_{GEN}$ of the generator. The armature winding is typically placed into a slotted laminated steel core. The generator also includes a rotor having rotor winding 14, which is fed with a DC field current to produce an electromagnetic field that rotates with the rotor to produce a revolving field with a strength that is proportional to the field current.

A mutual flux develops across an air gap between the rotor and stator, which interact to produce an electro-magnetic force (EMF). As magnetic flux developed by the DC field poles of the rotor winding 14 crosses the air gap of the stator windings 12, a sinusoidal voltage is produced and output by the generator as $V_{GEN}$. The magnitude of the AC voltage $V_{GEN}$ output by the generator is controlled by the amount of DC excitation current that is supplied to the field winding 14 of the rotor. The frequency of the voltage developed by generator 10 depends upon the speed of the rotor, which is also affected by the excitation current supplied to the rotor field winding 14. The frequency of the generator will typically be influenced by variations or transients of the load on the generator. For example, a sudden increase in the load may cause a reduction of the generator's frequency.

An Automatic Voltage Regulator (AVR) 16 is a device that controls the output voltage of a synchronous electric generator to keep the output voltage constant as load changes. This is achieved by controlling the Field Current $I_{FIELD}$ in the field winding 14 of the rotor as a function of the generator's output voltage. AVR 16 controls $I_{FIELD}$ by controlling the field voltage $V_{FIELD}$ output to power section 18, which is generally a relatively high current device. The field winding 14 of the rotor can be connected directly to the AVR 16 and power section 18 by sliprings and brushes, but another approach is brushless excitation, wherein the field winding 14 is fed by an exciter thus eliminating the brushes.

AVRs are typically used to control the field or excitation current to the rotor in order to maintain the output voltage of the generator at a constant frequency and voltage. A typical automatic voltage regulator (AVR) monitors the output voltage $V_{GEN}$ of the generator and modulates the excitation current $I_{FIELD}$ to rotor field winding 14 in response to variations in frequency and voltage level of $V_{GEN}$, which will be affected by variations in load 20 coupled to the generator output.

The aim of AVR design is to maximize performance for a given Prime Mover/Exciter/generator configuration. One of ordinary skill in the art would generally understand this to mean (1) control the output voltage within a small deviation range (e.g. less than 3%) of the nominal voltage on a steady state condition and (2) respond rapidly to changing loads, i.e the transient response is designed in a way that protects the load connected to it and makes good use of the prime/mover/generator being controlled. Often the AVR will be required to start up from residual magnetism (i.e. there is no separate power supply from which the AVR can excite the rotor winding in order to start the generator function).

There are generally four main performance considerations that are normally addressed in AVR design in order to control the generator output voltage under varying load conditions. A first design consideration is to adjust the generator output voltage within a given range (usually +/−10% around a nominal voltage, i.e. 120 VAC line to ground) and maintain the selected voltage in spite of load changes. In steady state conditions, most modern AVRs will maintain the voltage within 3% regulation or better from no load to full load. Some modern AVRs can maintain 1% regulation, but, in practice, anything below about 2% provides no significant benefit since electric utilities voltage regulation can often change as much as 5% and most loads are rated to operate properly within a range of +/−10% of the nominal line voltage level.

A second AVR design consideration is regulating under heavy transient loads to minimize the initial voltage drop. FIG. 2 is a graph illustrating a typical transient response of a conventional AVR in response to the introduction of a heavy transient load, such as the activation of a motor. An AVR is generally expected to minimize the initial voltage drop and then recover to steady state regulation within 3% or better of specified voltage output from no load to full load. A sub-transient voltage drop period immediately following the introduction of the heavy transient typically averages five cycles, which is shown in the graph of FIG. 2 at an 80 millisecond period at 87 V. The sub-transient period is followed by a transient period wherein the voltage output recovers to within a given tolerance of the target output voltage level. The sum of the two periods is usually termed recovery time. In many AVRs, the sub-transient voltage drop is in the range of 25-30% for a recovery time in the range of 250 to 500 milliseconds for a transient load demand ranging from 5% to 95% of the generator's rated capacity in kilovolt-amperes (KVA).

A third common AVR design consideration is to maintain a constant Volt to Hertz (V/Hz) ratio in spite of frequency variations, thus avoiding saturation of the electromagnetic components of the load (e.g. transformers, motors, etc.). This characteristic should have an adjustable start frequency (i.e. the maximum frequency from which the V/Hz ratio starts, such as 60 Hz) and vary from the maximum operating frequency to a minimum that is the lowest expected frequency expected during an overload.

A fourth AVR design consideration is to provide a flexible V/Hz capability that can be adjusted so as to assist the recovery of the prime mover/exciter/generator combinations in case of a heavy transient overload. Flexibility means, in this case, to have the ability to: (A) adjust the V/Hz ratio from 1:1 to a higher value so that the output voltage will drop faster as the prime mover speed decreases as a result of a transient overload; and (B) set the frequency at which the V/Hz ratio begins to automatically adjust, such as a predetermined frequency below 60 Hz (usually between 59.5 Hz to 57 Hz) in order to provide regulation for light to moderate load changes.

The above four considerations are typically sufficient for stand-alone generator operation. If parallel operation is called for, then a fifth consideration called droop control may be required, which may be readily combined with some embodiments of the present invention.

SUMMARY

According to one aspect of the present invention, an automatic voltage regulator circuit is shown that has a direct current power supply circuit that receives a power signal to be regulated, full wave rectifies the received power signal and generates a DC reference voltage signal, where the DC reference voltage corresponds to a desired steady state operating voltage level for the power signal. A line sampling circuit receives the power signal and compares it to the DC reference voltage signal in order to generate a line sync signal synchronized to the oscillation of the power signal. A quadrature signal generator circuit receives the line sync signal and produces a pair of phase signals that are synchronized to the line sync signal and 90° out of phase with one another. The quadrature signal generator circuit includes a phase locked loop circuit configured to lock onto the frequency of the line sync signal using a lock frequency that is at least twice the oscillation frequency of the power signal, where the phase locked loop circuit outputs a phase error signal that corresponds to a phase difference between the line sync signal and an oscillating frequency of the phase locked loop. A quadrature sync circuit receives the two phase signals and generates a quadrature signal that is in quadrature with the line sync signal. A sample and hold circuit receives the quadrature signal and the full wave rectified power signal and samples the peak voltages of the full wave rectified power signal using the quadrature signal and holds the sampled peak voltages to produce a voltage level control signal representing a current absolute magnitude of the amplitude of the power signal. An error amplifier receives the reference voltage, the voltage level control signal, and a damping signal and subtracts the error signal and the damping signal from the reference voltage in order to produce a duty cycle modulation signal. A duty cycle modulator circuit receives the duty cycle modulation signal and produces a field voltage control signal that oscillates at a predetermined frequency with a duty cycle controlled by the duty cycle modulation signal. A stabilizer circuit low-pass filters the field voltage control signal to produce the damping signal. In a preferred refinement, the phase locked loop of the quadrature signal generator circuit operates at a lock frequency that is at least four times the oscillation frequency of the power signal.

A refinement of the automatic voltage regulator circuit includes a frequency control circuit that receives a frequency reference voltage and the phase error signal and subtracts the frequency reference voltage from the phase error signal to produce a frequency control signal representing a phase correction for the power signal. The error amplifier circuit is modified to receive the frequency control signal and subtract it from the reference voltage in producing the duty cycle modulation signal. In another refinement, the error amplifier circuit is configured to receive a droop control signal and subtract it from the reference voltage in producing the duty cycle modulation signal.

One refinement of the automatic voltage regulator circuit includes a digital frequency control circuit converts the phase error signal to a digital phase error signal, multiplies the digital phase error signal by a voltage to Hertz slope parameter, subtracts a reference voltage parameter, and multiplies by a scaling factor to produce a scaled frequency error signal. The digital frequency control circuit also compares the scaled frequency error signal to a frequency threshold parameter and, if the scaled frequency error signal value is less than the frequency threshold parameter, sets a frequency control value to a reference value corresponding to a desired frequency of the power signal, and, otherwise, sets the frequency control value to the frequency threshold parameter. Further, the digital frequency control circuit multiplies the frequency control value by an output voltage level parameter to produce a digital frequency control signal and converts the digital frequency control signal to an analog frequency control signal. In this refinement, the error amplifier circuit is modified to subtract the analog frequency control signal from the reference voltage in producing the duty cycle modulation signal.

In still another refinement of the automatic voltage regulator circuit, the error amplifier is composed of a digital error amplifier circuit that converts the voltage level control signal to a digital voltage level control signal, low pass filters the field voltage control signal to produce a damping signal, and converts the damping signal to a digital damping signal. The digital error amplifier circuit multiplies the digital damping signal by a predetermined damping factor to produce a modified digital damping signal, computes a difference between the modified digital damping signal and the digital voltage level control signal to produce a digital difference signal, and multiplies the digital difference signal by a predetermined gain factor to produce an amplified digital difference signal. The digital error amplifier pulse width modulation encodes the amplified digital difference signal to produce the duty cycle modulation signal.

According to another aspect of the present invention, a method is shown for automatic voltage regulation of a generator involving full wave rectifying a power signal of the generator, sampling the power signal and comparing it to a DC reference voltage signal corresponding to a desired steady state operating voltage level for the power signal in order to generate a line sync signal synchronized to an oscillation frequency of the power signal. The method also calls for producing first and second phase signals that are synchronized to the line sync signal and 90° out of phase with one another. The method further involves using a phase locked loop to lock onto the frequency of the line sync signal using a lock frequency that is at least twice the oscillation frequency of the power signal and generating a phase error signal that corresponds to a phase difference between the line sync signal and an oscillating frequency of the phase locked loop. Using the first and second phase signals, a quadrature signal is generated that is in quadrature with the line sync signal. The method also includes sampling the peak voltages of the full wave rectified power signal using the quadrature signal and holding the sampled peak voltages to produce a voltage level control signal representing a current absolute magnitude of the amplitude of the power signal. The error signal and the damping signal are subtracted from the reference voltage in order to produce a duty cycle modulation signal. The duty cycle modulation signal is used to produce a field voltage control signal, where the field voltage control signal oscillates at a predetermined frequency with a duty cycle controlled by the duty cycle modulation signal. The damping signal is produced by low-pass filtering the field voltage control signal. In a preferred refinement, the lock frequency of the phase locked loop is at least four times the oscillation frequency of the power signal.

A further refinement of the method calls for subtracting a frequency reference voltage from the phase error signal to produce a frequency control signal representing a phase correction for the power signal and producing the duty cycle modulation signal further involves subtracting the frequency control signal from the reference voltage.

Another refinement of the method calls for converting the phase error signal to a digital phase error signal, multiplying the digital phase error signal by a voltage to Hertz slope parameter, subtracting a reference voltage parameter, and multiplying by a scaling factor to produce a scaled frequency error signal. The scaled frequency error signal is compared to a frequency threshold parameter and, if the scaled frequency error signal value is less than the frequency threshold parameter, a frequency control value is set to a reference value corresponding to a desired frequency of the power signal, and, otherwise, the frequency control value is set to the frequency threshold parameter. A digital frequency control signal is produced by multiplying the frequency control value by an output voltage level parameter. The digital frequency control signal is converted to an analog frequency control signal. And producing the duty cycle modulation signal further involves subtracting the analog frequency control signal from the reference voltage.

Still another refinement of the method calls for converting the voltage level control signal to a digital voltage level control signal, low pass filtering the field voltage control signal to produce a damping signal, and converting the damping signal to a digital damping signal. A modified digital damping signal is produced by multiplying the digital damping signal by a predetermined damping factor. A difference is computed between the modified digital damping signal and the digital voltage level control signal to produce a digital difference signal. The digital difference signal is multiplied by a predetermined gain factor to produce an amplified digital difference signal. And the amplified digital difference signal is pulse width modulation encoded to produce the duty cycle modulation signal.

BRIEF DESCRIPTION OF THE DRAWINGS

Various embodiments in accordance with the present disclosure will be described with reference to the drawings, in which.

Note that the same numbers are used throughout the disclosure and figures to reference like components and features.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Figure 16:
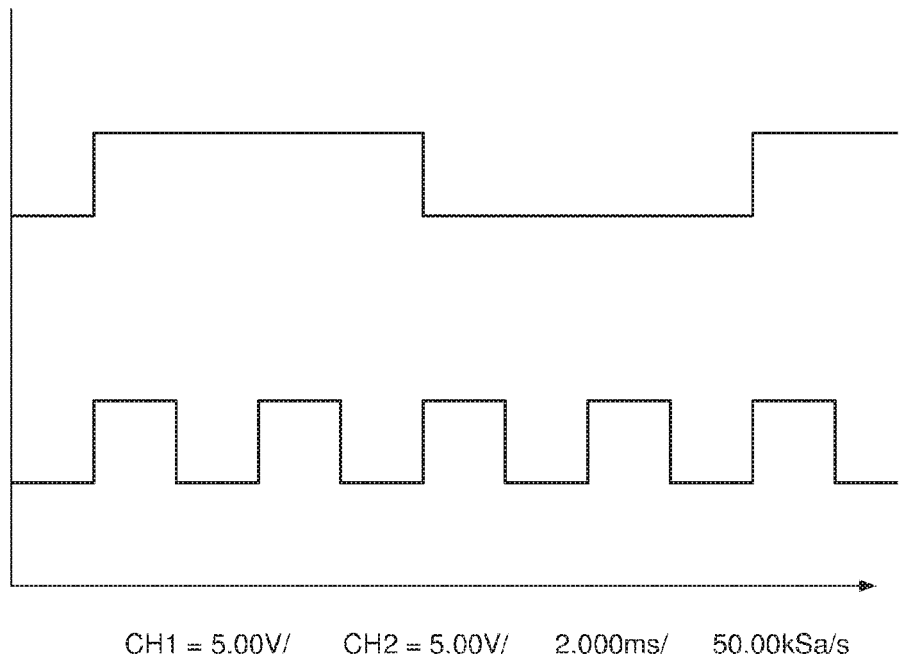
FIG. 16 is a photograph of an oscillogram illustrating a relationship between a line voltage sample signal and an output signal from a phase locked loop circuit in one example of an automatic voltage regulator.

According to one aspect of the present invention, a frequency synthesis technique is utilized to perform automatic voltage regulation to maintain the output voltage, rapidly recover from voltage drops due to heavy transients, and maintain a voltage to frequency (V/Hz) ratio under varying output loads. In one aspect of the frequency synthesis technique, a higher multiple frequency of a reference signal corresponding to the generator's desired output frequency is produced and phase locked to the reference signal by the use of a Phase Lock Loop (PLL) in conjunction with a frequency divider. The higher frequency signal is a multiple N of the reference frequency, where N is the division factor of the frequency divider. In one example, to regulate a generator configured to operate at 60 Hz, the frequency of the voltage controlled oscillator (VCO) of the PLL is 240 Hz and N is 4. FIG. 16 is an oscillogram illustrating the relationship between a line sync signal $V_{LS}$ (upper trace) and the PLL frequency (lower trace) in this example.

The frequency of the output voltage of the generator is obtained by sampling the output voltage, such as with a transformer or other line sensing circuit. The sensed output voltage frequency is then compared to a reference voltage $V_{REF}$, which is a stable temperature compensated DC voltage reference. In the examples described below, $V_{REF}$ is fixed at 6.8 Volts, but other reference voltage levels may be utilized in other embodiments without departing from the teachings of the present invention. The output of the comparator is the line sync signal ($V_{LS}$), which is a square wave signal that is in phase with the output voltage of the generator. The $V_{LS}$ signal produced is a fast, clean and in-phase square wave AC voltage signal representing the generator's output phase. This signal is fed into the PLL voltage comparator to produce a flexible Volts/Hz capability that stems from using the PLL as a frequency to voltage converter.

This PLL based frequency synthesis technique can reduce delay in the response of the AVR to transient conditions in the output voltage to improve recovery from transient conditions. The frequency synthesis technique may also permit a higher chopper frequency to be used in a DC modulator circuit that drives a power section to produce the field current in the field winding of the generator rotor, which may further reduce feedback delay in the AVR. The frequency synthesis technique may also produce a feedback control signal with a reduced noise level, such as the example shown in FIG. 19, which facilitates the introduction of derivative feedback. Note that in some high power applications, a three phase, full wave, one or two quadrant, depending upon the operational requirements, SCR bridge rectifier circuit may be employed in place of the chopper circuit. Response time may increase, e.g. 2.8 msec versus 1 msec, for the chopper function and the response may be less linear, but the long time constants generally associated with large, high power machines may permit such a substitution without departing from the teachings of the present invention.

Figure 3:
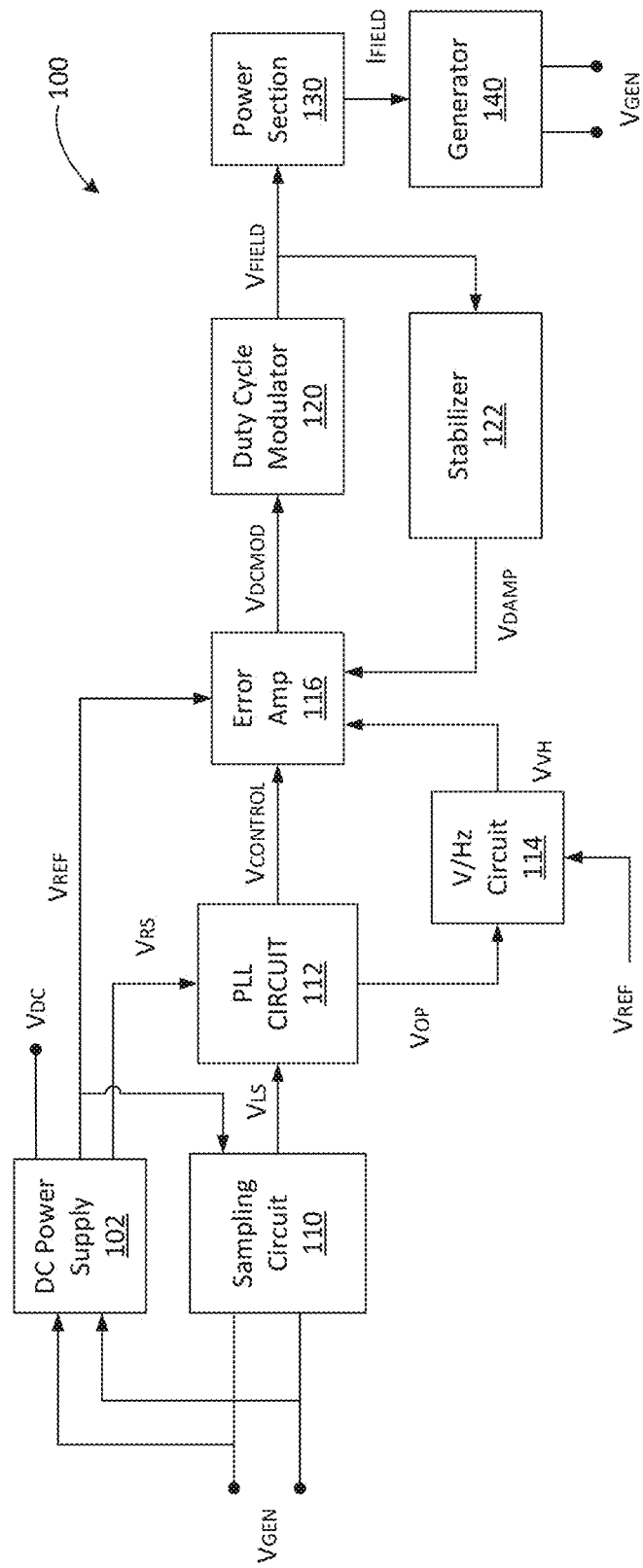
FIG. 3 is a functional block diagram illustrating an example of an automatic voltage regulator system in accordance with the present invention.

FIG. 3 is a block diagram that illustrates one embodiment of a simplified AVR circuit 100 illustrating some aspects of the present invention. The output voltage of the generator $V_{GEN}$ is input to DC power supply circuit 102, which then generates: a DC supply voltage VAC to power components in AVR circuit 100; a stable DC reference voltage $V_{REF}$; and a full wave rectified signal $V_{RS}$ that reflects $V_{GEN}$.

Figure 4:
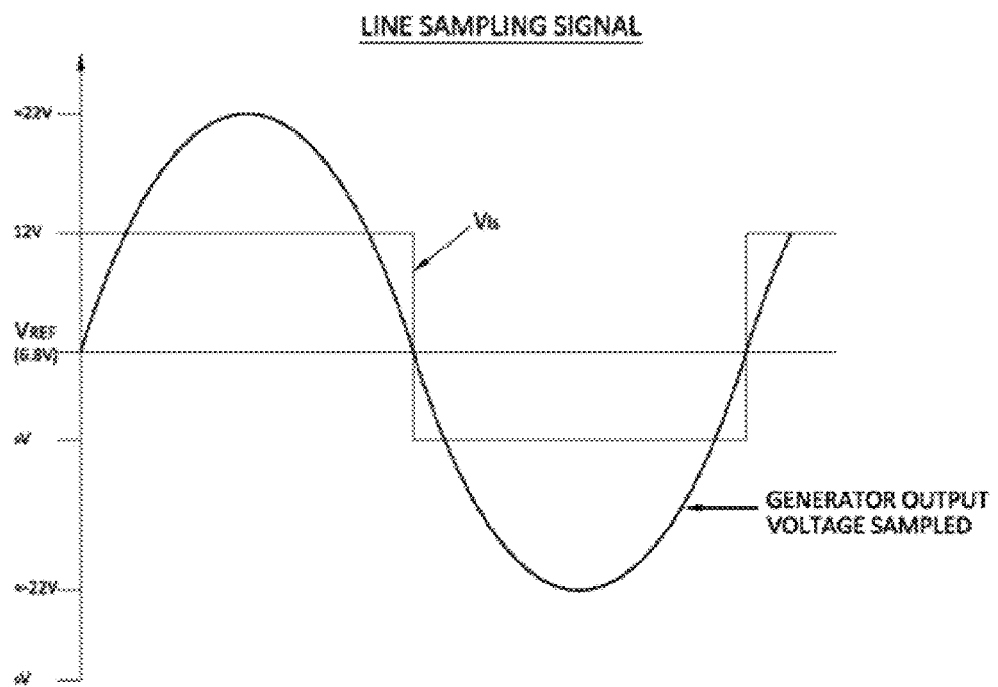
FIG. 4 is a diagram illustrating a comparison of one example of a line sampling signal to a sampled generator output voltage signal.

The output voltage of the generator $V_{GEN}$ is also input to sampling circuit 110, which samples the output voltage $V_{GEN}$ and compares it to $V_{REF}$ in order to produce line sense voltage signal $V_{LS}$, which represents the frequency of $V_{GEN}$. The output of the comparison is a square wave signal that is in phase with $V_{GEN}$. FIG. 4 is a graph illustrating the signal waveform of $V_{LS}$ in response to oscillations in $V_{GEN}$ with respect to $V_{REF}$, which is 6.8 V in the example shown.

Figure 1:
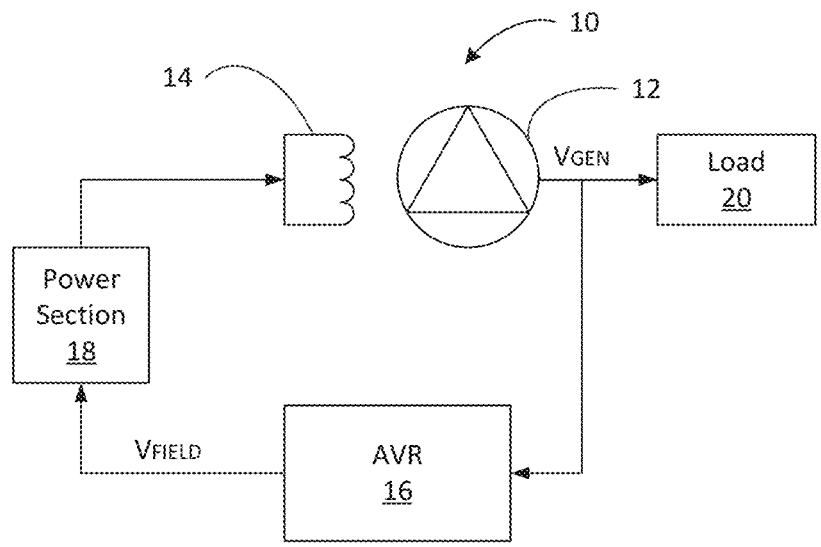
FIG. 1 is a schematic diagram illustrating a simplified example of a generator system with automatic voltage regulation.
Figure 2:
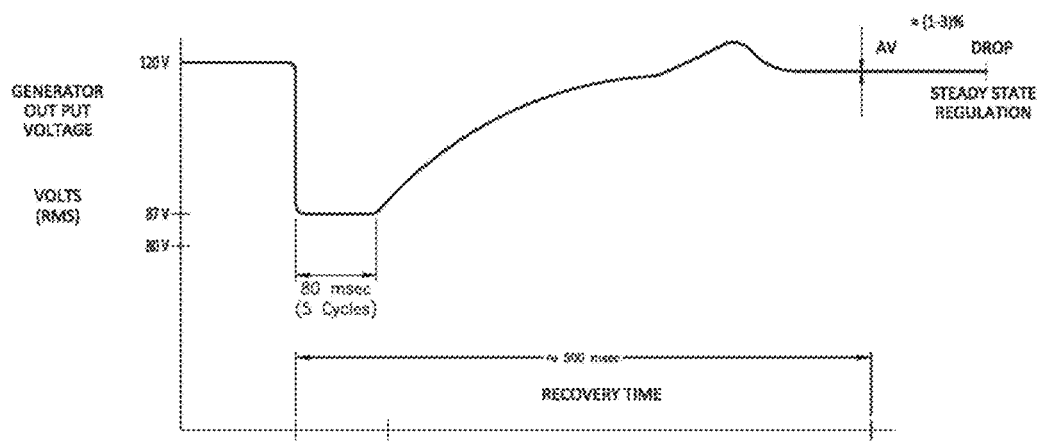
FIG. 2 is a graph illustrating an example of a transient response of a conventional automatic voltage regulator.

$V_{LS}$ and $V_{RS}$ are input into PLL circuit 112 of FIG. 2, which uses $V_{LS}$ to identify the peaks in $V_{RS}$ and sample the magnitude of those peaks in order to produce control signal $V_{CONTROL}$, which represents the absolute magnitude of the voltage of $V_{GEN}$. Note that $V_{CONTROL}$ is a DC level signal that can be compared to the DC reference voltage $V_{REF}$ in order to generate a clean and precise error signal, which is important for regulating under heavy transient overloads to improve the transient response of the AVR control loop.

PLL circuit 112 also produces phase error voltage signal $V_{OP}$, which is the output from a voltage controlled oscillator (VCO) in the PLL and represents a highly responsive voltage to frequency conversion signal that reflects variations in the frequency of $V_{GEN}$. $V_{OP}$ may be transformed into a voltage to Hertz control signal $V_{VH}$ that engages when the frequency of $V_{GEN}$ drops below a selected threshold, e.g. the 60 Hz operating frequency, to increase the frequency back to the selected operating frequency.

$V_{CONTROL}$, $V_{REF}$, $V_{VH}$ and a damping signal $V_{DAMP}$ are all input to error amplifier 116, which subtracts the $V_{CONTROL}$, $V_{VH}$ and $V_{DAMP}$ voltages from $V_{REF}$ in order to produce an error voltage signal that is amplified and output as a duty cycle modulator control voltage $V_{DCMOD}$. The voltage level of $V_{DCMOD}$ is input to duty cycle modulator circuit 120, which may also be referred to as a chopper. The voltage level of $V_{DCMOD}$ controls the duty cycle of a square wave signal having a predetermined frequency, e.g. 1 KHz, that is output as $V_{FIELD}$. $V_{FIELD}$ drives power section or exciter 130 to produce $I_{FIELD}$, which is the current in the rotor field for generator 140. $V_{FIELD}$ is fed back through stabilizer 122 to produce the damping signal $V_{DAMP}$, which is an internal negative feedback path that dampens the level of modulation to maintain the stability of the control loop.

For automatic voltage regulation, if the voltage of $V_{GEN}$ drops, such as due to introduction of a heavy transient load, then the peak magnitudes of $V_{RS}$ will drop, which is sampled by PLL circuit 112 and reflected in the voltage level of $V_{CONTROL}$. This, in turn, will impact the voltage level of $V_{DCMOD}$ causing the duty cycle of $V_{FIELD}$ to increase, thereby increasing the field current $I_{FIELD}$, which, in turn, increases the voltage level of $V_{GEN}$. As the voltage level of $V_{GEN}$ returns to its preselected level, e.g. 120 VAC, as reflected by $V_{RS}$, $V_{CONTROL}$ will return to its steady state level causing $V_{DCMOD}$ to return to steady state and reducing the duty cycle of $V_{FIELD}$ to its steady state level.

Likewise, for frequency control, if the frequency of $V_{GEN}$ drops, this will be reflected in the voltage level of the phase error signal $V_{OP}$. If the frequency drop exceeds a preselected threshold, then voltage to Hertz circuit 114 will modify the voltage level of $V_{VH}$, which will cause error amplifier 116 to modify $V_{DCMOD}$ to decrease the duty cycle of $V_{FIELD}$ and increase the frequency of the generator output voltage $V_{GEN}$. As the frequency of $V_{GEN}$ returns to the selected operating frequency, $V_{OP}$ and, thus, $V_{VH}$ return to steady state levels resulting in $V_{DCMOD}$ reducing the duty cycle of $V_{FIELD}$ to a steady state consistent with the operating frequency.

In accordance with one aspect of the present invention, some embodiments may permit adjustment of the generator output voltage within a given range, typically +/−10% around a nominal voltage, i.e. 120 VAC line to ground, and maintain the selected voltage in spite of load changes within a specified steady state regulation specification, such as below 3%. This is achieved by generating a difference or error signal $V_{CONTROL}$ that results from the difference between a reference DC voltage and the sampling of the output voltage of the generator.

In accordance with another aspect of the present invention, the generation of a fast responding clean error signal permits some embodiments of the present invention to regulate under heavy transient overloads. The significance of a high quality error signal may be observed from the basic relationship that links the error signal to the output voltage of the generator. In simplified form, this relationship may be expressed as: $V_{GEN}=H(s)*V_{ERROR}$, where $H(s)$ is the open loop transfer function for the combination of the error amplifier, demodulator, exciter, and generator components.

Figure 5:
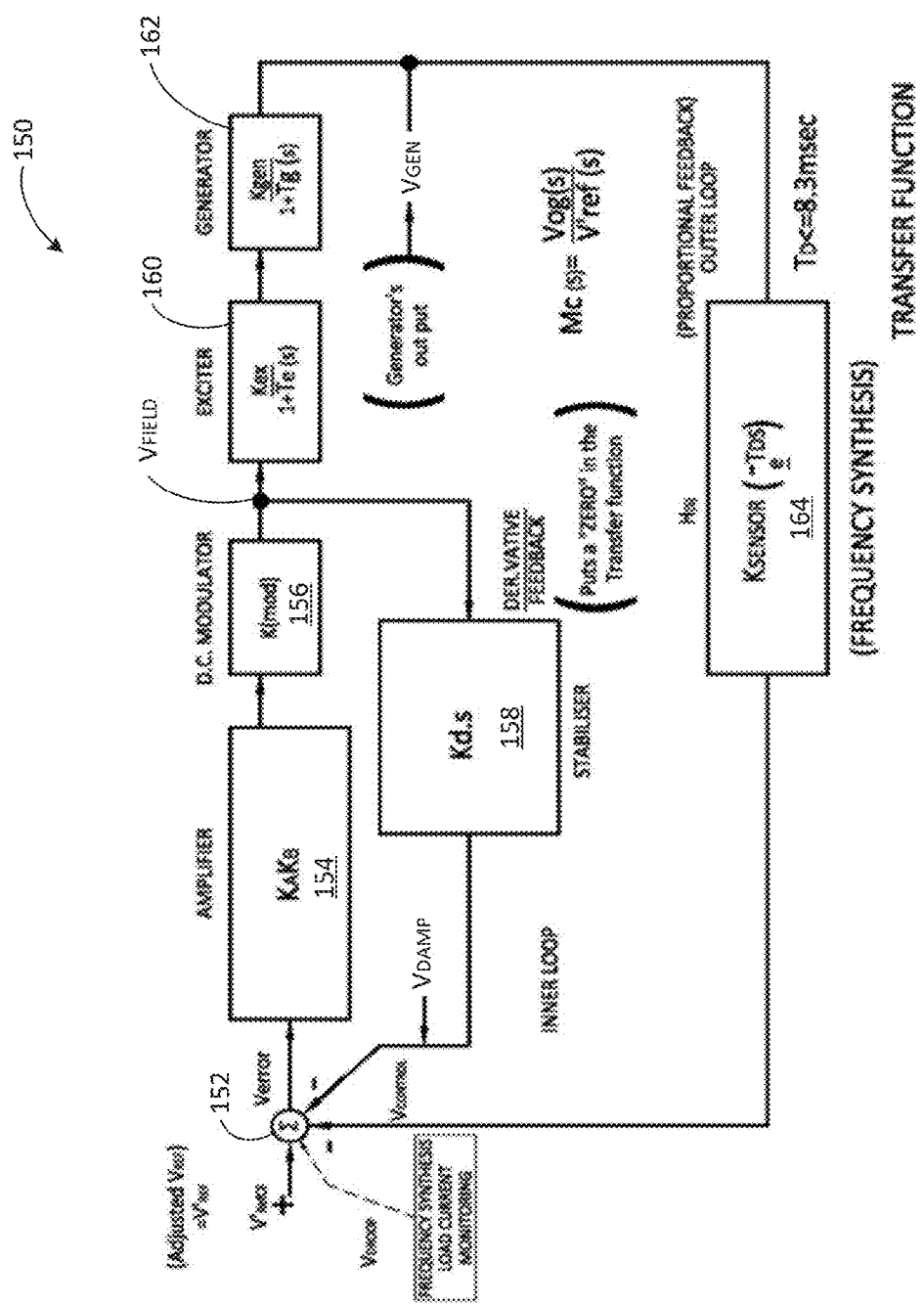
FIG. 5 is a functional block diagram illustrating an example of a transfer function for automatic voltage regulation in accordance with the present invention.

FIG. 5 is a block diagram illustrating in greater detail an example of a transfer function 150 representing a portion of the circuit of FIG. 3. At 152, the clean error signal $V_{CONTROL}$ obtained from sampling the output voltage $V_{GEN}$ is compared to the reference voltage $V_{REF}$ in order to produce a voltage signal $V_{ERROR}$ representing the difference between the desired output voltage, which is determined by magnitude of $V_{REF}$, and the actual output voltage of $V_{GEN}$. Note that by changing $V_{REF}$, the desired output voltage for the generator system may be adjusted. This represents the outer control loop that provides proportional feedback for regulating the generator output voltage, and which includes the amplifier gain 154, the duty cycle modulator gain 156, the exciter's gain and delay 160, the generator's gain and delay 162 and the sensor's delay 164. An inner control feedback loop introduces a stabilizer gain to produce $V_{DAMP}$ by introducing a zero to the transfer function.

In FIG. 5, the open loop transfer function, that is the Transfer Function with the proportional feedback or outer loop open can be expressed as follows:

$$H(s) = \frac{Ka * Kb * K\text{mod} * Kex * Kgen * (1+Td)}{(1+Te)(1+Tg)}$$

wherein:
Te=Exciter's time constant;
Tg=Generator's time constant;
Ka, Kb=Gains of amplifiers in the error amplifier circuit;
Kmod=Gain of the duty cycle modulator;
Kex=Gain of the exciter;
Kgen=gain of the generator; and Td is the zero that is introduced by the derivative feedback of the inner loop.

Td represents an amount of derivative control that used in proportion to the ordinary proportional control provided by the outer loop and that may be adjusted.

Accounting now for the introduction of $V_{DAMP}$ to the summer 152, as well as an optional $V_{DROOP}$ signal to control load current, $V_{ERROR}$ can be represented as follows:

$V_{ERROR} = V_{REF}' - V_{CONTROL} - V_{DAMP} - V_{DROOP}$

Here, $V_{REF}'$ is an adjusted value of $V_{REF}$ that results from the output voltage control. For an example, see the voltage signal VRO of the error amplifier circuit 550 of FIG. 12, which is obtained by adjusting a potentiometer that is the generator output voltage control. In this example, $V_{REF}$ is a temperature compensated voltage reference of 6.8 Volts. In addition, it is assumed, in this example, that the time constants associated with the error amplifier and power sections are well below time constants Te and Tg. Examples of reference values reflecting these assumptions is, in milliseconds, 70<Te<500 and 400<Tg<1000. Table 1 below illustrates an example of the gain calculations to achieve a 1% steady state regulation specification:

TABLE 1

| Steady State Regulation Calculations | | Units |
| --- | --- | --- |
| Required Regulation No load to Full load | 1% | |
| Max Peak Output Change 120 VAC 1% Regulation | 1.70 | Volts |
| Proportional feedback loop constant "Ksensor" | 0.032 | |
| Maximum Field excitation Voltage | 100.0 | Volts |
| Error signal magnitude at 1% Regulation | 0.055 | Volts |
| Total Gain required | 1831 | |
| DC Modulator gain at 160 V max output chopper voltage, DC = 1 | 64 | |
| Required Combined Error Amplifier Gain | 35 | |
| Chosen Combined Gain for error amplifiers | 36 | |

Figure 12:
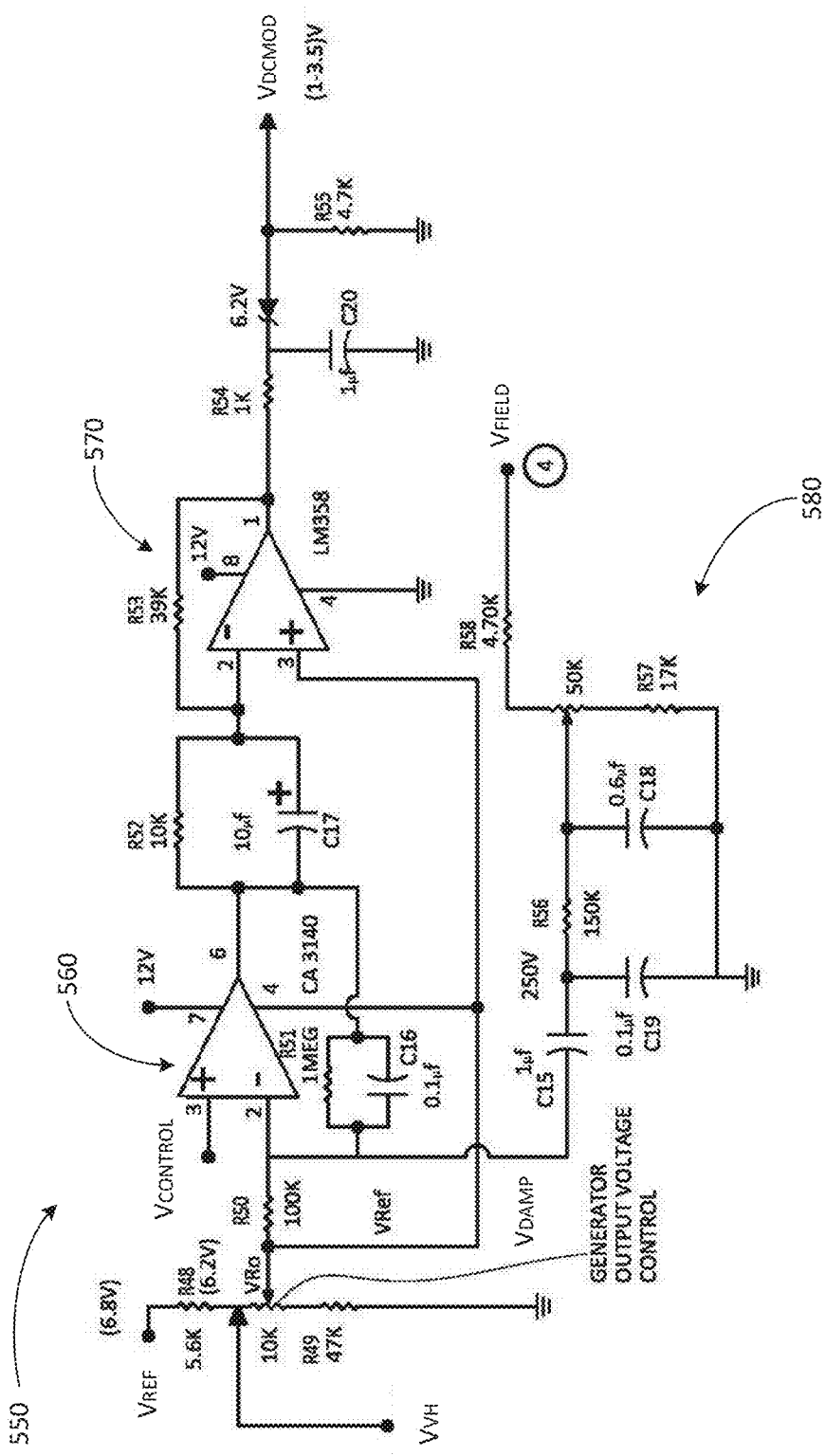
FIG. 12 is a circuit diagram illustrating an example of one embodiment of circuitry for the error amplifier circuit shown in FIG. 7.

$V_{DAMP}$ is a voltage signal corresponding to the derivative of an attenuated voltage, where Kd is the attenuating constant in this example, that feeds the field of the exciter $V_{FIELD}$. For example, the error amplifier circuit of FIG. 12 shows $V_{FIELD}$ passing through an adjustable attenuation network in order to produce $V_{DAMP}$. $V_{DROOP}$ is an optional signal voltage that is a function of the output current of the output generator and is included here to demonstrate how droop control may be readily added to the circuit.

From the Transfer Function of FIG. 5, it may be observed that if the $V_{ERROR}$ signal is zero, then no excitation will be available to the primary field of the exciter. In order to maintain regulation at steady state, the combined gain of the error amplifier and DC Modulator circuits is relatively high. The reference values provided in FIG. 5 and Table 1 above illustrate one example of values that produce sufficient gain for sufficient steady state operation.

Figure 11:
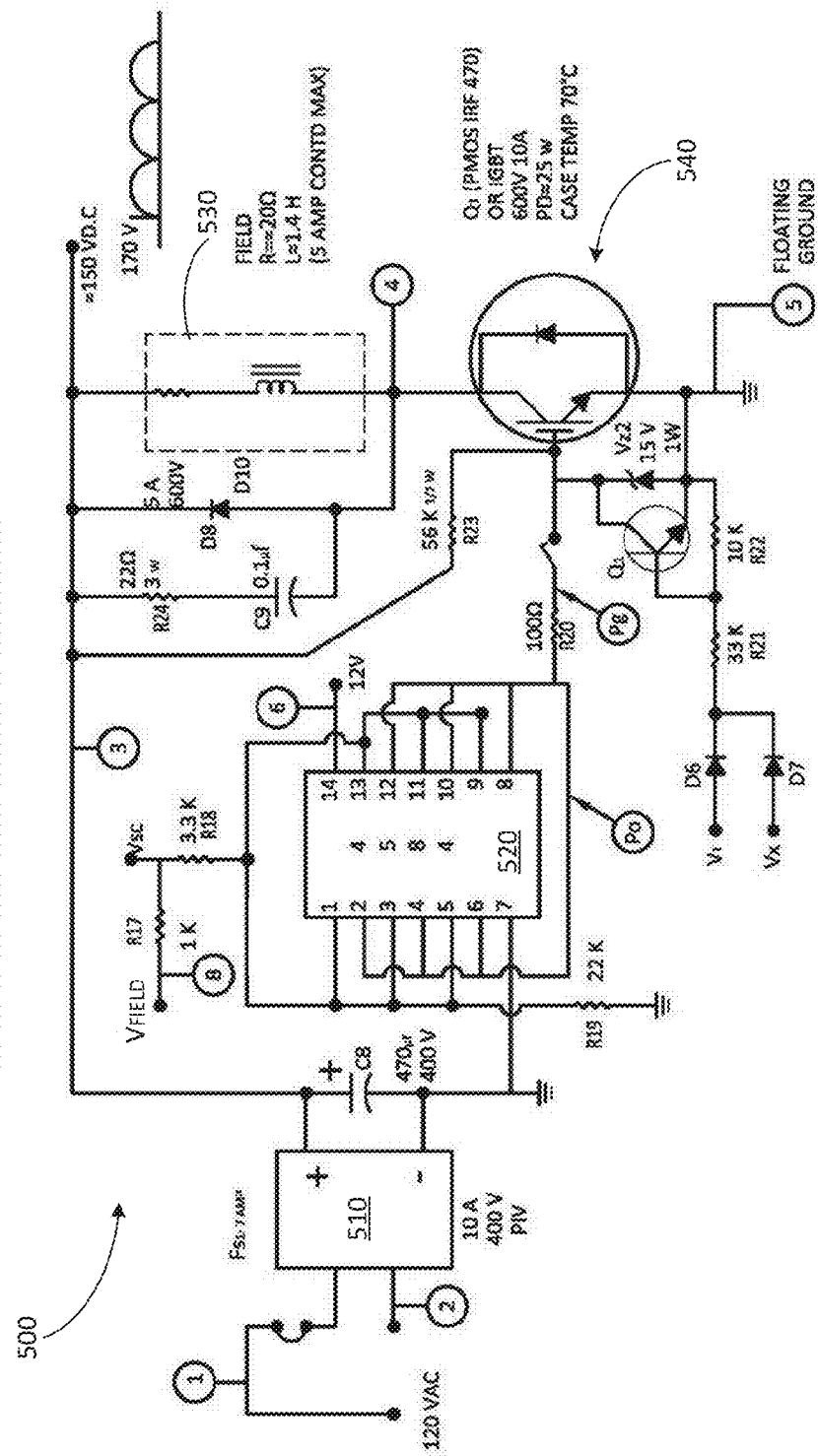
FIG. 11 is a circuit diagram illustrating an example of one embodiment of circuitry for the power section circuit shown in FIG. 7.
Figure 14:
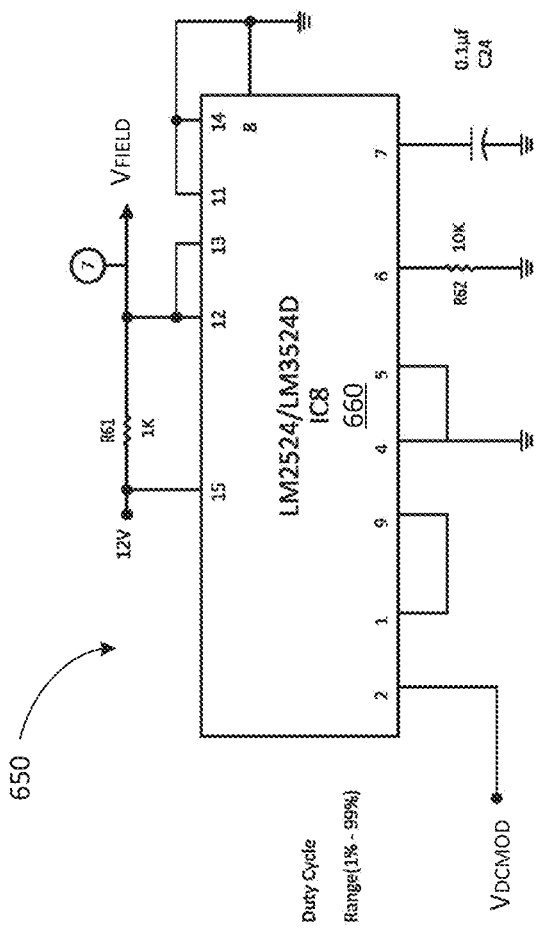
FIG. 14 is a circuit diagram illustrating an example of one embodiment of circuitry for the duty cycle modulator circuit shown in FIG. 7.

In FIG. 5, the outer loop from the generator output through frequency synthesis transfer block 164 to summer 152 provides Proportional Feedback from the sensed generator output, which results in generation of $V_{CONTROL}$. The error signal $V_{ERROR}$ that results from the proportional feedback is a clean DC level signal. The inner loop from the output of DC modulator 156 through stabilizer block 158 produces the $V_{DAMP}$ signal, which is subtracted at summer 152 and provides Derivative Feedback from the field voltage $V_{FIELD}$. The amount of derivative feedback is controlled by adjusting the value of Kd in stabilizer block 158, which also adjusts the value of Td as discussed above. This is commonly known as Damping Control in commercial AVRs. In the example discussed herein, the DC modulator block 156 is implemented as a chopper that operates at 1 Khz and is driven by a duty cycle modulator circuit. For example, as illustrated in FIGS. 11 and 14, the chopper 540 is an Insulated Gate Bipolar Transistor (IGBT) or Power MOSFET (e.g. IRF740) that is driven by a Duty Cycle modulator chip 520 (e.g. LM3524D). The resulting chopper signal is a modulated square wave signal $V_{FIELD}$, which drives the exciter's field. The higher chopper frequency in this example, when compared to standard 60 Hz Phase Control silicon controlled rectifier (SCR) circuits, provides for a smoother Field current waveform and minimizes the time delay associated with the power section. For example, the time delay with the IGBT chopper 540 at 1 khz will be less than 1 milliseconds (msec). For a Full Wave single phase SCR phase control circuit, the delay could be as high as 8.3 msec.

In order to generate the $V_{CONTROL}$ signal, the examples herein sample the peaks of the full rectified output voltage of the generator's output voltage. In the detailed example described herein with respect to FIG. 8, the output voltage is sampled through a transformer 302 followed by a two resistor network (RI and R2) that yields a peak voltage of 6.8V as the peak voltage of $V_{RS}$ from a generator output voltage $V_{GEN}$ of 120 VAC. The sampling of the full rectified peaks is accomplished by applying a sampling pulse that is synchronized with the peaks and is applied to a Sample and Hold circuit, such as the sample and hold circuit 600 shown in FIG. 13.

Figure 13:
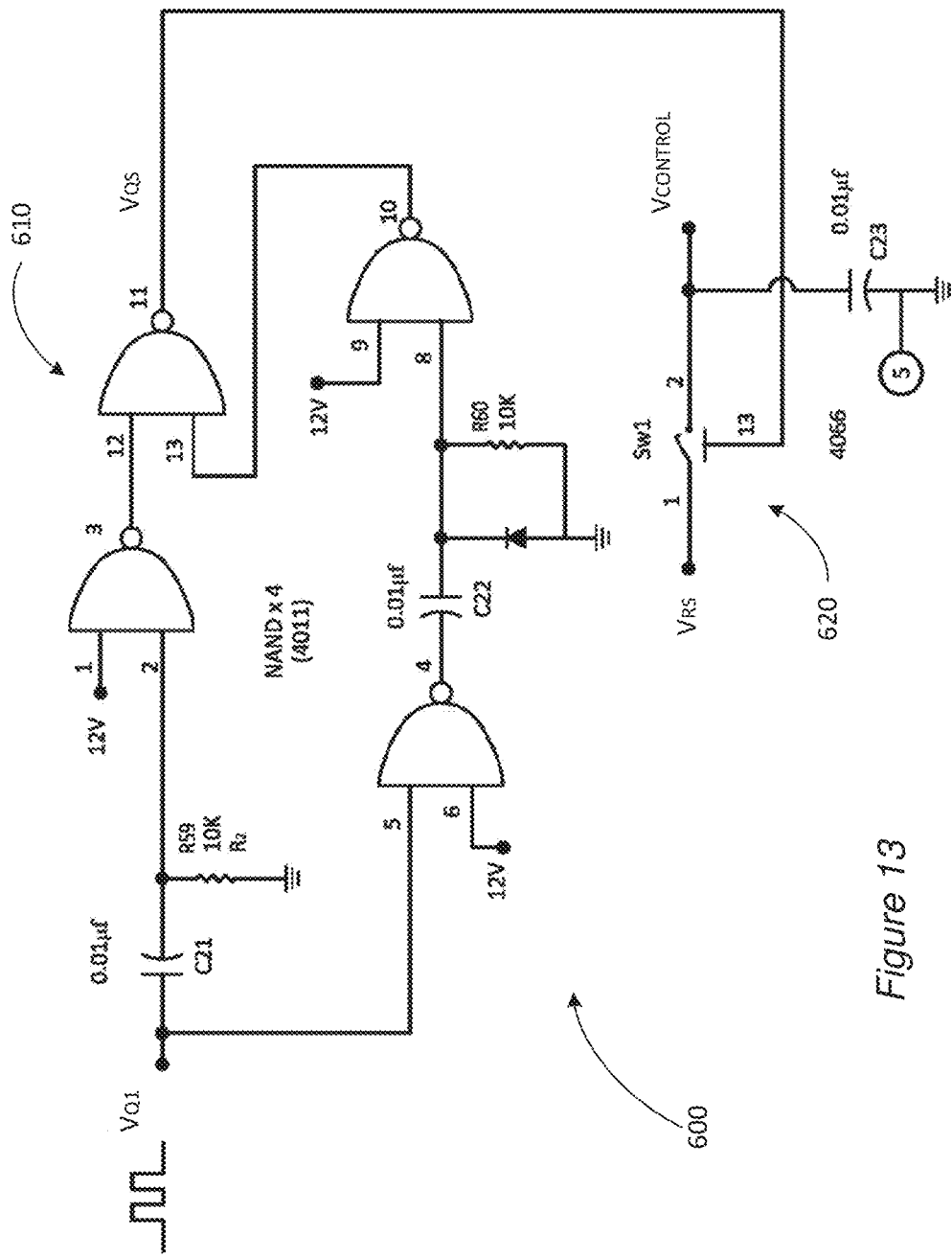
FIG. 13 is a circuit diagram illustrating an example of one embodiment of circuitry for the sample and hold circuit shown in FIG. 7.

In the example of FIG. 13, a pulse is generated in response to $V_{Q1}$ and closes switch Sw1 for the length of the pulse (i.e 100 µsec). $V_{Q1}$ passes through a sample pulse generation circuit 610 that has parallel signal pathways each constructed using NAND gates and high pass filters, wherein the received $V_{Q1}$ pulse travels at different speeds through each signal pathway. The difference in propagation time through the signal pathways results in a 100 microsecond pulse in the $V_{QS}$ signal that is synchronized to the peak of the $V_{RS}$ signal. The $V_{QS}$ signal drives switch Sw1 in holding circuit 620 to close for 100 microseconds to sample the $V_{RS}$ signal, which is a DC signal that is held in capacitor C23 and produces $V_{CONTROL}$.

Figure 6:
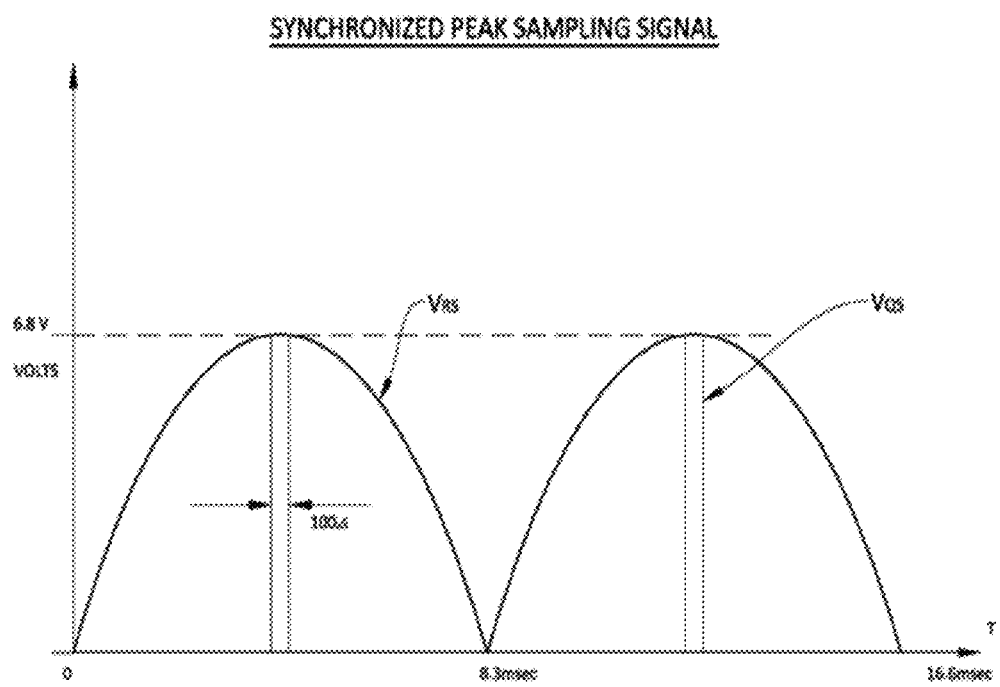
FIG. 6 is a waveform diagram illustrating an example of sampling of a rectified power signal to obtain a representation of a voltage level of the generator output voltage.

In this example, the Sample and Hold (S/H) circuit 600 is sampling the peaks for 100 microseconds (µsecs) and holding the sampled value for 8.3 milliseconds, i.e. 180 degrees or half a cycle at 60 Hz, until another peak arrives. The resulting $V_{CONTROL}$ signal for a constant generator output voltage will be a substantially stable DC voltage level. Voltage variations in the generator output voltage level, in this example, are sampled and updated every 8.3 milliseconds. FIG. 6 is a waveform diagram that illustrates the sampling pulses produced in sampling signal $V_{QS}$ in response to $V_{Q1}$. As FIG. 6 illustrates, the rectified voltage signal $V_{RS}$ is sampled for 100 µsec at the peaks of the $V_{RS}$ signal and held for 8.3 msec. In practice, the $V_{RS}$ waveform may become distorted due to the sampling circuitry, such as a sampling transformer. However, the transient performance of an AVR in accordance with certain aspects of the present invention would not be significantly affected because the sampling of the rectified output voltage $V_{RS}$ occurs for a relatively small interval of time at substantially the peak of the voltage waveform. As a result, the control signal $V_{CONTROL}$ is resistant to distortion, such as the harmonic distortion introduced by a sampling transformer or the generator's output voltage. Predictable sources of distortion can be offset by adjusting the output voltage control VRO, which is set at 6.8 Volts in this example, to compensate for the distortion. A voltage change at the generator's output will change the DC level of $V_{CONTROL}$.

In this aspect of the present invention, the approach to designing the Transfer Function is to reduce the time response associated with the AVR control circuitry in the proportional feedback control loop to be substantially less, e.g. by a factor of approximately 10 to 40 times, than the time constants associated with the Exciter (Te) and the Generator (Tg). The error amplifier time constant, e.g. Ta and Tb, provide lead compensation to the error amplifier section. In this example, Ta corresponds to Amplifier 560 and Tb corresponds to Amplifier 570 in the error amplifier 550 of FIG. 12. Tcs and Tcd correspond to low pass filters in the derivative feedback network 580 of FIG. 12 and are significantly less than Te and Tg and are for the purpose of filtering out noise, which provides a clean damping signal $V_{DAMP}$ at the summing node.

The sensor time constant Td has a delay of less than 8.3 msec. This removes a root of the characteristic equation normally associated with the voltage sensor and replaces it with a 8.3 msec time delay. The use of time delays in transfer functions is understood by those of skill in the art. Hence, the complete Transfer Function M(s) for an AVR in accordance with an aspect of the present invention can be described in terms of H(s), as defined above, as follows:

$$M(s)=H(s)/(1+H(s)K_{SENSOR}*e^{-\tau ds}),$$

where τds represents the maximum time delay resulting from the frequency synthesis and sample and hold circuits described herein.

The response of the AVR is fast enough to produce the damping control signal $V_{DAMP}$ generated in the error amplifier circuit 550 shown in FIG. 12. $V_{DAMP}$ improves the stability margin by adding a zero in the transfer function. Those of skill in the art will understand the use of derivative feedback effect to a closed loop transfer function to compensate for the roots introduced by Te or Tg, which typically have time constants on the order of 70 to 500 msec and against the disturbances introduced by load changes thus maintaining stability. For example, see Kuo, Benjamin, *Automatic Control Systems*, 3d Edition 1975; Vleeshouwers, *Derivation of the Model of the Exciter for Synchronous Machine*, Einhoven University of Technology EUT Report 92-E-258, June 1993; Glover et al., *Power Systems Analysis and Design*, 3rd edition, Brooks/Cole (2002).

Figure 7:
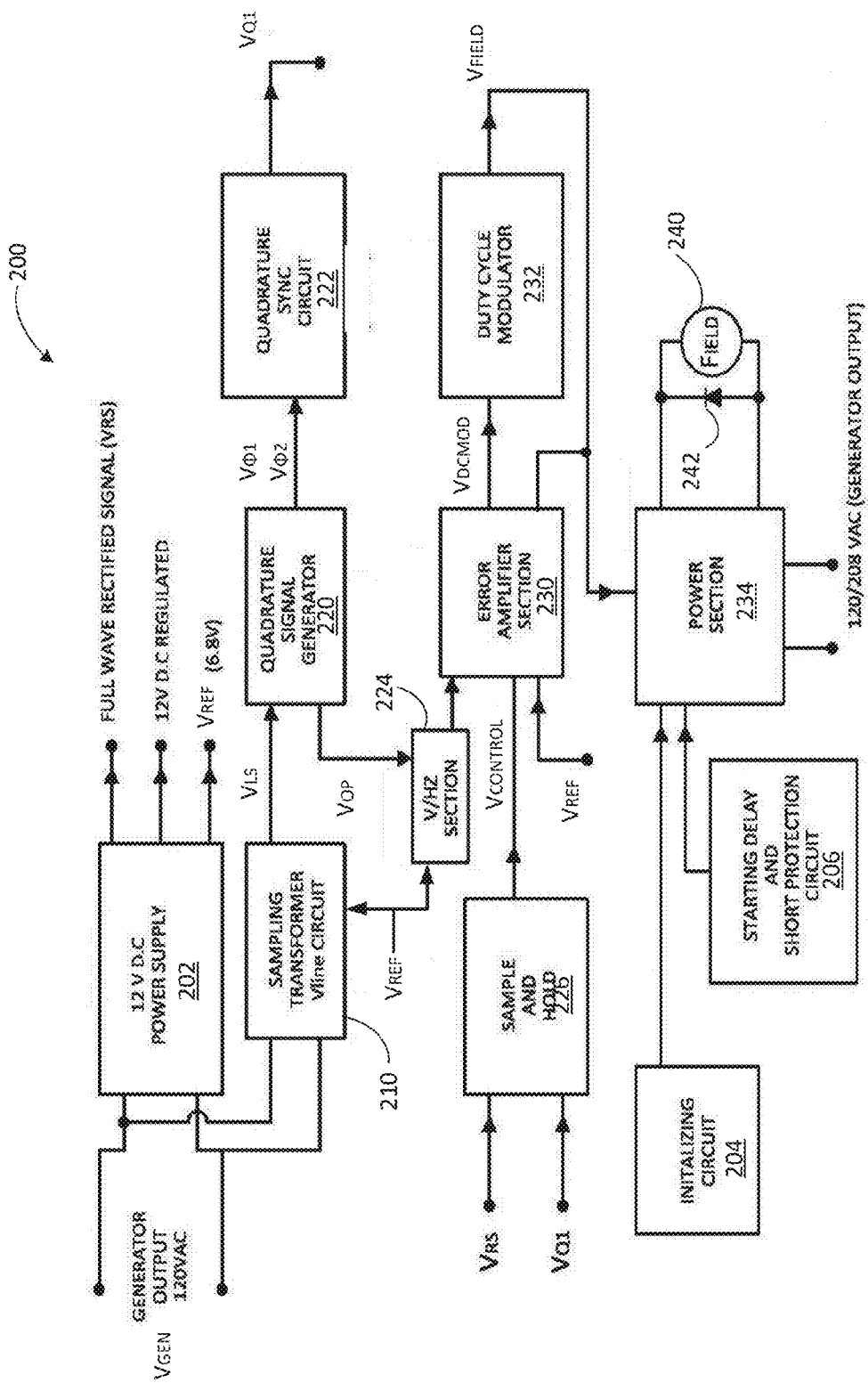
FIG. 7 is a functional block diagram illustrating another example of an automatic voltage regulator in accordance with some aspects of the present invention.

FIG. 7 is a block diagram illustrating one example of an automatic voltage regulator circuit 200 in accordance with the present invention, which is configured to regulate an output voltage $V_{GEN}$ of a generator electrically coupled to the AVR 200 by controlling the current provided to a field winding 240 for the exciter of the generator.

Figure 8:
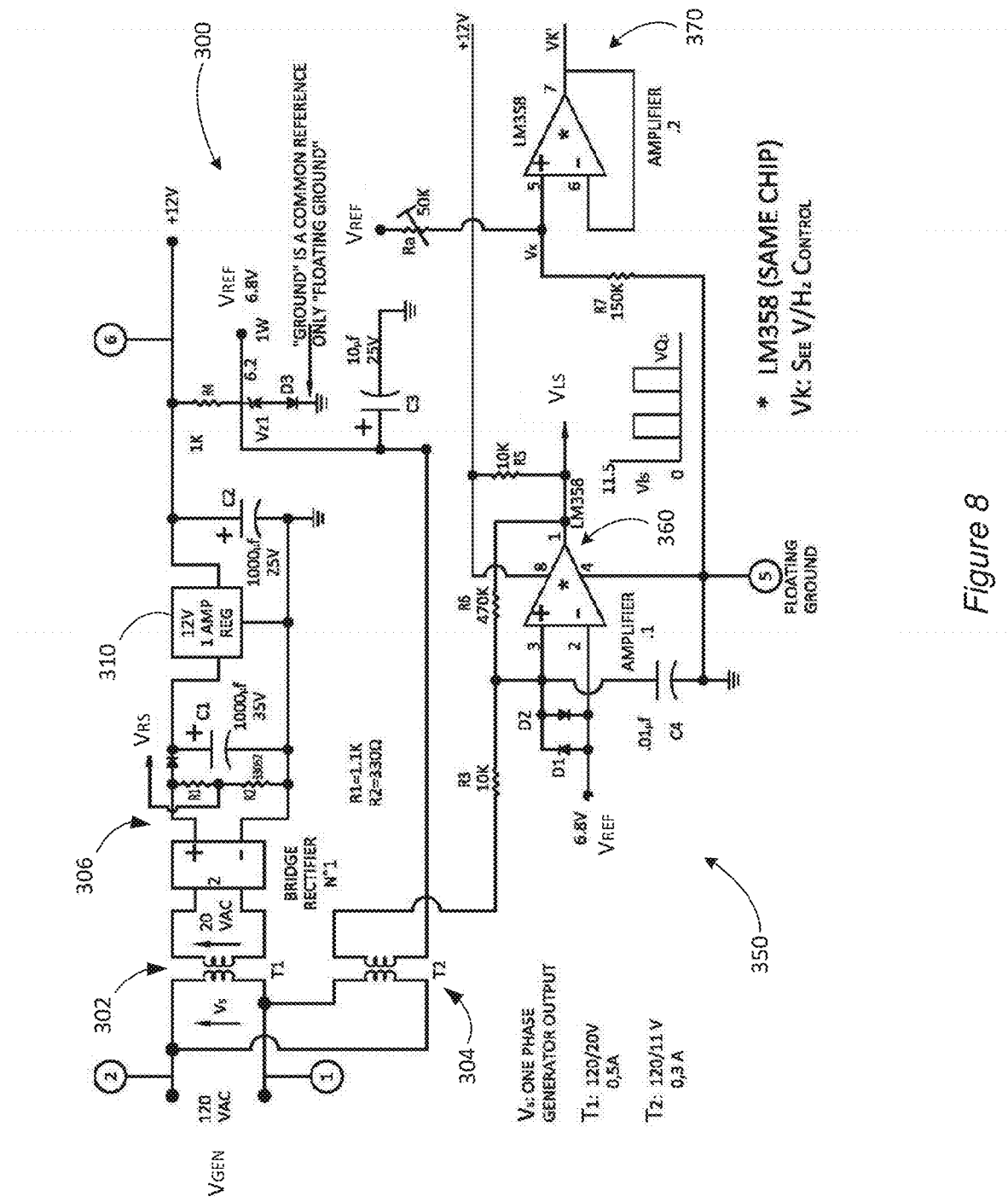
FIG. 8 is a circuit diagram illustrating an example of one embodiment of circuitry for the DC power supply and line sampling circuits shown in FIG. 7.

A DC voltage power supply 202 is configured to receive $V_{GEN}$ and produce a 12 volt DC regulated supply voltage, which is the power supply to other components in AVR 200, full wave rectify $V_{GEN}$ to produce rectified voltage signal $V_{RS}$, and produce a stable reference voltage $V_{REF}$, which is 6.8 V in this example and is corresponds to the steady state operating voltage level of $V_{GEN}$ for which AVR 200 is designed. Other steady state operating voltage levels may call for different reference voltage levels. A line sampling circuit 210 is also configured to receive $V_{GEN}$ and compare it to $V_{REF}$ in order to generate line sync signal $V_{LS}$, which is a square wave with pulses synchronized to the oscillation of the generator output voltage $V_{GEN}$. FIG. 8 shows an example of a detailed embodiment of the circuitry for DC power supply 202 and line sampling circuit 210.

Figure 17:
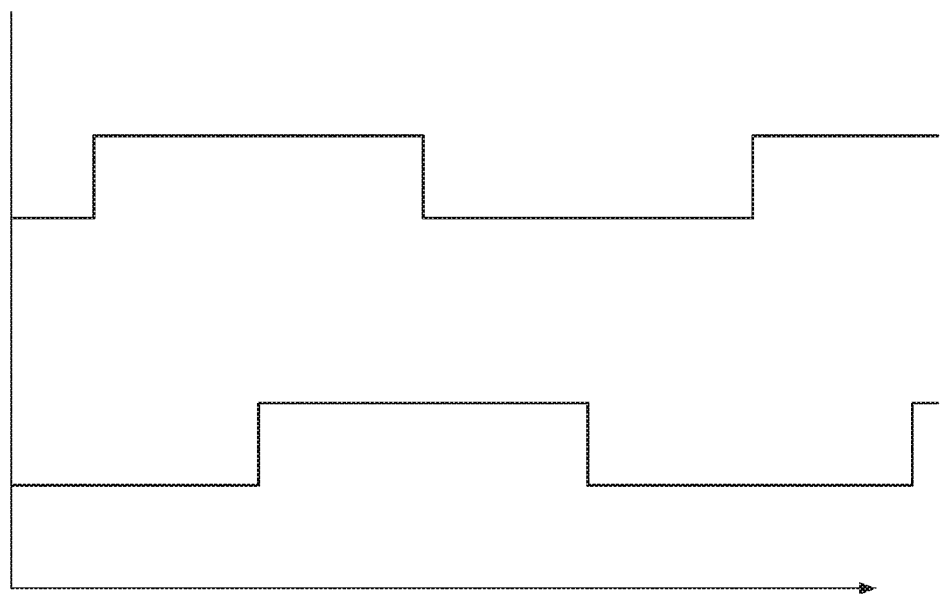
FIG. 17 is a photograph of an oscillogram illustrating a relationship between a line voltage sample signal and a quadrature signal produced in one example of an automatic voltage regulator.

Quadrature signal generator circuit 220 includes a phase locked loop (PLL) circuit that locks onto the frequency of line sync signal $V_{LS}$ and, using a lock frequency that is a multiple of the desired generator frequency, produces a pair of square wave signals VΦ1 and VΦ2 that are 90° out of phase with one another and synchronized with $V_{LS}$. Quadrature sync circuit 222 uses VΦ1 and VΦ2 to generate a quadrature signal $V_{Q1}$ that is in quadrature with $V_{LS}$, i.e. phase shifted by 90°. $V_{Q1}$ is a square wave signal aligned to the peaks of the generator output voltage $V_{GEN}$. $V_{Q1}$ is fed to sample and hold circuit 226, which transforms $V_{Q1}$ into a short duration pulse, e.g. 100 μsec, aligned with the peaks of the generator output voltage $V_{GEN}$ that sample and hold circuit 226 uses to sample the peak voltages of the rectified voltage signal $V_{RS}$, which represents the absolute magnitude of $V_{GEN}$. Sample and hold circuit 226 samples the peaks of $V_{RS}$ and outputs generator control signal $V_{CONTROL}$, which is a DC voltage signal that represents the current voltage level of $V_{GEN}$. FIG. 17 is an oscillogram illustrating the relationship between $V_{LS}$ (upper trace) and $V_{Q1}$ (lower trace) in this example.

Quadrature signal generator circuit 220 also outputs a phase error signal $V_{OP}$ from the PLL that is an error output voltage signal that effectively converts the phase difference between the $V_{LS}$ signal and the oscillating frequency of the PLL to a voltage signal that can be used by Voltage to Hertz control circuit 224 to control the frequency of the generator. Voltage to Hertz control circuit 224 utilizes the DC phase error signal $V_{OP}$ and utilizes the reference voltage signal $V_{REF}$ to produce a voltage to frequency control signal $V_{VH}$ that represents a phase correction needed to maintain the desired frequency of $V_{GEN}$.

Error amplifier section 230 receives DC voltage signals $V_{CONTROL}$, $V_{VH}$, $V_{REF}$ and damping feedback voltage $V_{DAMP}$. Error amplifier 230 subtracts $V_{CONTROL}$, $V_{VH}$ and $V_{DAMP}$ from $V_{REF}$, which determines the desired output voltage level, in order to produce duty cycle modulation signal $V_{DCMOD}$. Note that droop control may be readily obtained in this example by providing a DC voltage signal for droop control that is also summed in error amplifier 230. $V_{DCMOD}$ is a DC voltage control signal that reflects the reference voltage selected to determine the desired output voltage level of $V_{GEN}$, the voltage level of $V_{GEN}$ sensed at the generator output, the phase of the sensed voltage signal, and damping control for stability. At steady state, these voltage signals will remain substantially stable.

$V_{DCMOD}$ drives duty cycle modulator 232, which, in this example, includes an oscillator that provides a chopper frequency, e.g. 1 kHz, used to produce field voltage control signal $V_{FIELD}$. $V_{FIELD}$ is a square wave signal oscillating at the chopper frequency where the duty cycle of the square wave is controlled by $V_{DCMOD}$. For example, when output voltage level of $V_{GEN}$ drops, e.g. in response to introduction of a transient load, this impacts $V_{CONTROL}$ and, in turn, causes $V_{DCMOD}$ to increase the duty cycle of $V_{FIELD}$. The increased duty cycle of $V_{FIELD}$ increases the current in the field winding 240 of the generator causing the output voltage level of the generator to increase. Similarly, if the frequency of $V_{GEN}$ drops, then this will be reflected in $V_{VH}$, which will cause $V_{DCMOD}$ to decrease the duty cycle of $V_{FIELD}$, which also increases the frequency of $V_{GEN}$ in order to maintain the output frequency. $V_{DAMP}$ provides an internal stabilization control for the AVR circuit. Power section 234 includes high current devices that converts $V_{FIELD}$ into the field current in field winding 240.

Figure 18:
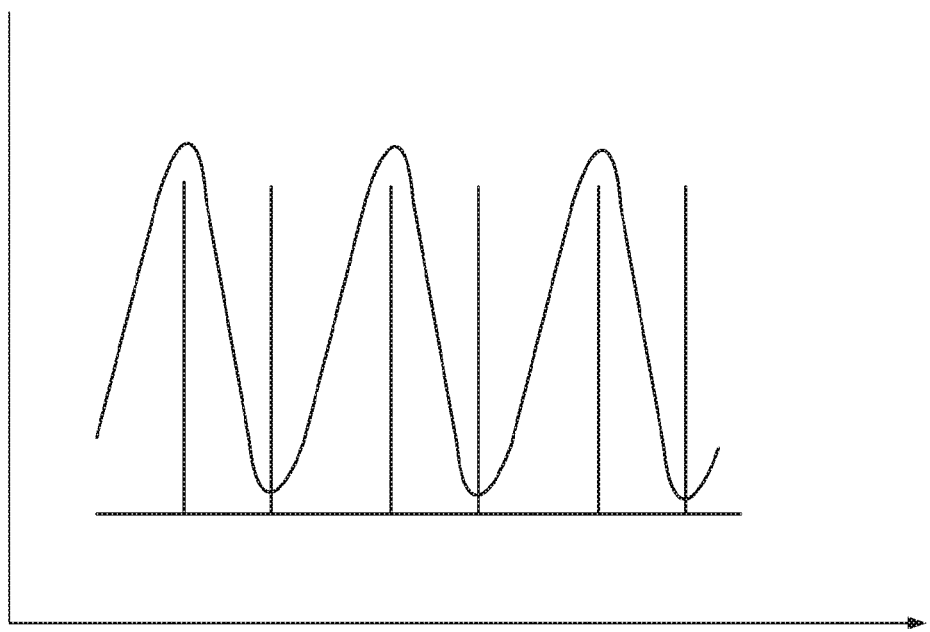
FIG. 18 is a photograph of an oscillogram illustrating a relationship between a line voltage signal and sampling pulses produced in one example of an automatic voltage regulator.

Synchronization is important for sampling the voltage level of $V_{GEN}$ so that the sampling pulses are substantially aligned with the peaks of $V_{GEN}$, as represented in absolute terms in $V_{RS}$. To maintain accuracy, synchronization should be maintained even in the event that the generator's output voltage changes in frequency, which often occurs when a transient load is introduced. In the present example, the sampling pulses of $V_{QS}$ are generated using a signal that is 90 deg out of phase with $V_{LS}$. This signal is the quadrature signal of $V_{LS}$ and is labeled $V_Q$. In an example of an implementation of quadrature synchronization circuit 222 shown in FIG. 10. Output frequency tracking capability is used to maintain a 90 degree phase shift between $V_{LS}$ and $V_Q$ to maintain the accuracy of sampling of the peaks of $V_{GEN}$. FIG. 18 is an oscillogram illustrating the relationship between $V_{GEN}$, which is represented by the sinusoidal trace, and a quadrature sampling signal, which is represented by the trace with sampling pulses aligned to the positive and negative peaks of $V_{GEN}$.

Figure 9:
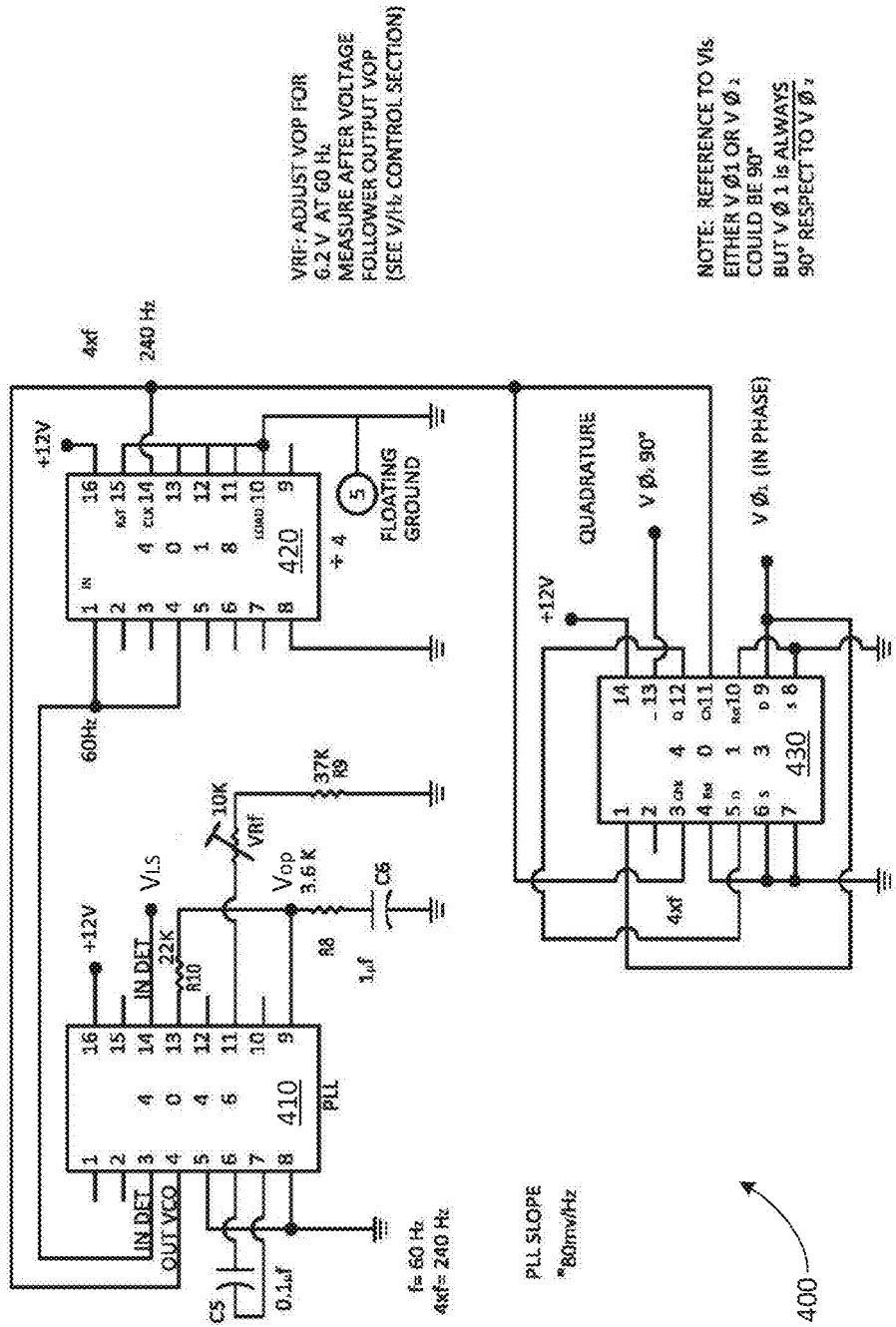
FIG. 9 is a circuit diagram illustrating an example of one embodiment of circuitry for the quadrature signal generator with phase locked loop circuit shown in FIG. 7.

In the present example, the frequency synthesis approach permits the generation of a square wave signal that is synchronized with the output voltage of the generator at four times the frequency. This is the output VOP of the voltage controlled oscillator (VCO) of PLL circuit 410 in one implementation of quadrature signal generator 220 that is shown in FIG. 9. The PLL circuit 410, which is an IC 4046 in this implementation, tracks the frequency and phase of the incoming signal $V_{LS}$ so that the output of the VCO is in phase lock at four times the frequency of $V_{LS}$. FIG. 16 is an oscillogram illustrating the relationship between $V_{LS}$ and the PLL output, wherein the upper trace represents $V_{LS}$, which is a 60 Hz line signal in this example, and the lower trace is PLL output OUT VCO obtained at pin 4 of the PLL IC 410, which is a type 4046 integrated circuit for a phase locked loop with voltage controlled oscillator in this implementation. A 240 Hz PLL signal (4×60) is in lock with the 60 Hz signal. In this implementation, PLL Lock was tested to 30 Hz (120 Hz VCO frequency) and showed a linear characteristic in V/Hz.

Figure 10:
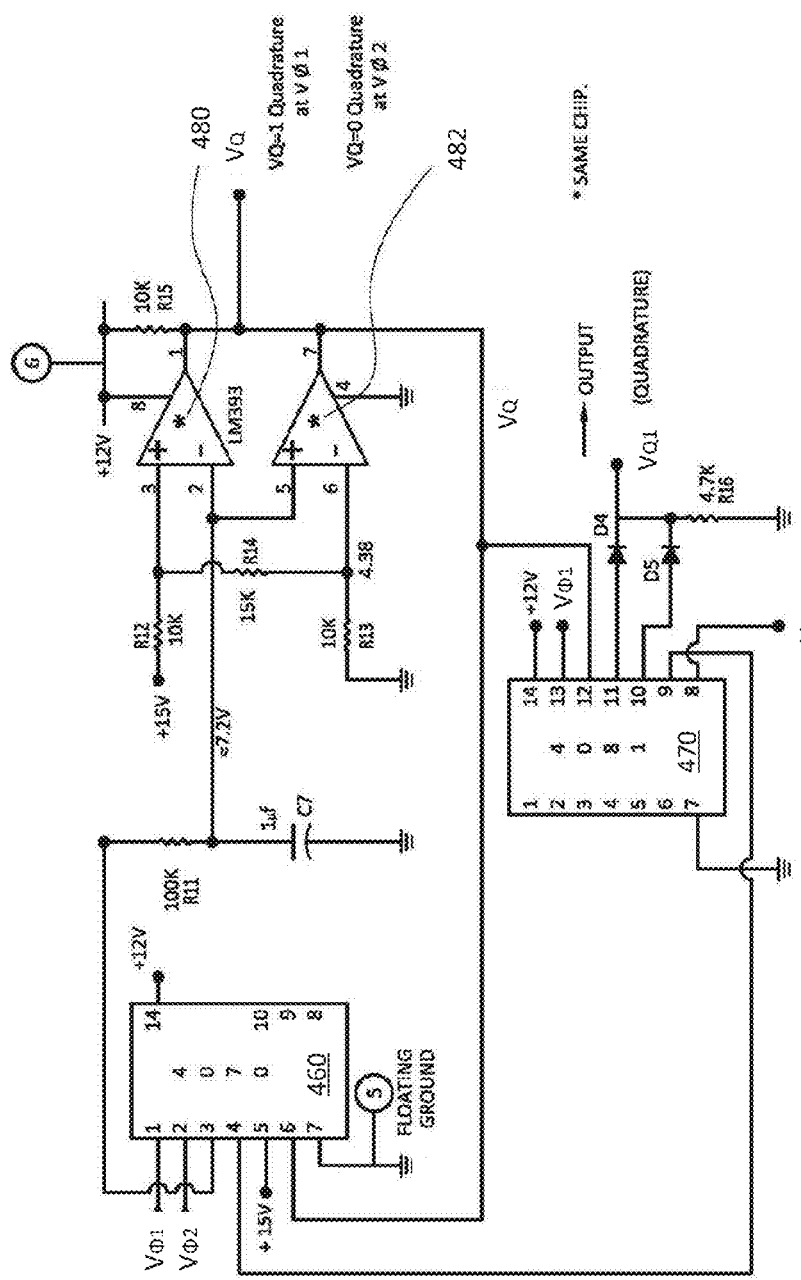
FIG. 10 is a circuit diagram illustrating an example of one embodiment of circuitry for the quadrature synchronization circuit shown in FIG. 7.

Quadrature Generator circuit 430, which is a type 4013 IC in this example, is a dual D flip flop connected so as to convert the 240 Hz signal output by the VCO to two 60 Hz signals VΦ1 and VΦ2 that are separated by 90 degrees and are fed to the Quadrature Sync Circuit 222. Quadrature Sync Circuit 222 transforms these signals into $V_{Q1}$, which is a signal separated by 90 degrees (e.g. quadrature) from $V_{LS}$. FIG. 10 illustrates an example of one implementation of quadrature sync circuit 222. The relationship is illustrated in the oscillogram of FIG. 17, wherein the upper trace is $V_{LS}$ and the lower trace is $V_{Q1}$. Quadrature signal $V_{Q1}$ is separated by 90 deg from $V_{LS}$, even if the frequency changes, so long as the PLL 410 in FIG. 9 holds lock.

The $V_{Q1}$ signal is input to Sample and Hold circuit 226, an example implementation of which is illustrated in FIG. 13. In FIG. 13, $V_{Q1}$ is passed through two separate signal paths, where each path has a high pass filter, which are implemented by capacitor and resistor combinations C21/R59 and C22/R60. The second high pass filter C22/R60 delays the edge with respect to the edge passing through the first path filter C21/R59 and into a set of NAND gates that transform the two delayed signals into a short duration switching pulse in $V_{QS}$. $V_{QS}$ controls a CMOS switch Sw1, implemented using a type 4066 IC in this example, which samples the rectified output voltage signal $V_{RS}$ at each peak, in this example, and holds the sampled DC voltage level using a capacitor C23 to produce the $V_{CONTROL}$ signal.

The $V_{QS}$ signal produced by the NAND gates 610 is a series of pulses that are synchronized to the output voltage $V_{GEN}$ even if the output frequency varies with the top and bottom peaks of the generator's output voltage. FIG. 18 is an oscillogram illustrating the relationship between the line voltage $V_{GEN}$, which is the sinusoidal trace, and the sampling pulses, which appear as spikes aligned with the peaks of the line voltage. $V_{CONTROL}$ is the result of synchronized sampling of the peaks of the full wave rectified generator's output voltage $V_{RS}$. The synchronized pulses are thus applied to the sample and hold circuit of FIG. 13 in order to produce a DC voltage signal $V_{CONTROL}$ that represents the peak voltage level of the generator's output voltage $V_{GEN}$, which is substantially level when $V_{GEN}$ is a constant voltage. In this example, $V_{QS}$ samples $V_{RS}$ every 8.3 msec.

Figure 19:
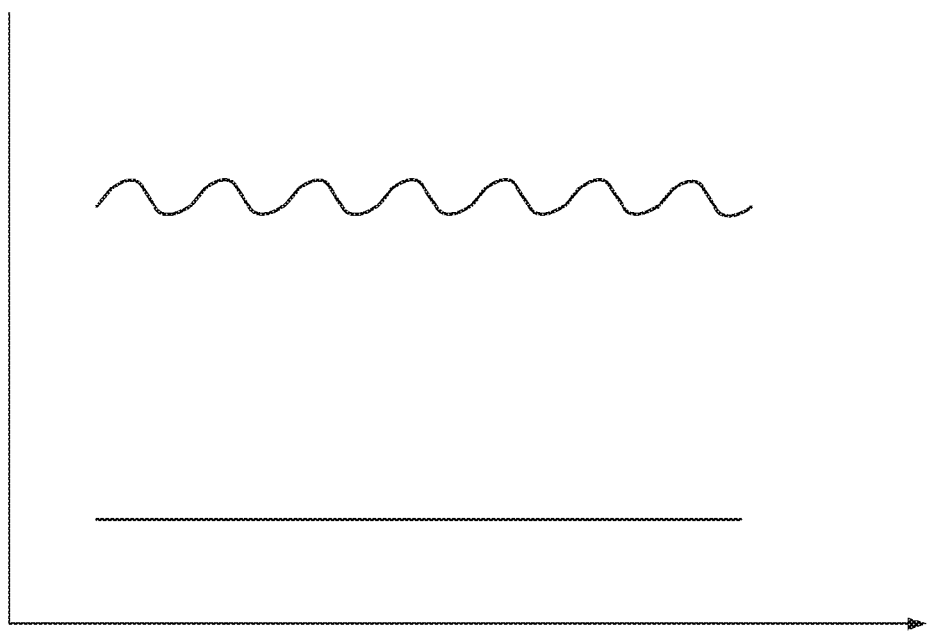
FIG. 19 is a photograph of an oscillogram comparing an example of an automatic voltage control signal sample produced by a conventional circuit using rectification and filtering and a control signal produced in one example of the present automatic voltage regulator.

The resulting control voltage $V_{CONTROL}$, obtained in accordance with the present invention, exhibits far less ripple voltage than the signal obtained from many conventional rectified RC type AVRs. FIG. 19 is an oscillogram that compares the control voltage obtained using a conventional approach utilizing full wave rectification with an RC filter with a 20 msec time constant versus the frequency synthesis approach of the present invention. In this example, the conventional signal is illustrated by the upper trace of the oscillogram and is essentially a saw tooth waveform. The upper trace shows a single phase full wave rectified and filtered 5V DC voltage with a 1.8 V peak to peak ripple. The level line of the lower trace of the oscillogram demonstrates an example of the $V_{CONTROL}$ signal obtained in accordance with the present invention when the output voltage of the generator $V_{GEN}$ is at steady state. Note that $V_{CONTROL}$, in this example, is a constant 5 VDC signal that does not exhibit the ripple that is present in the conventional control signal in the upper trace.

The sampling signal $V_{Q1}$ is in quadrature synchronization with $V_{LS}$, which, when fed through the sample and hold circuit of FIG. 13 obtains a stable, low noise voltage signal that is updated twice in every cycle of $V_{GEN}$. That is, at 60 Hz generator output frequency, the $V_{CONTROL}$ signal is updated every 8.3 milliseconds in the case of single phase sampling, which produces a high quality control signal compared to conventional AVR approaches that utilize full wave rectification with an RC filter. The $V_{CONTROL}$ signal accurately represents the amplitude of the peaks output by the generator and is updated every half a cycle (e.g. 8.3 msec at 60 Hz) even if the frequency drifts so long as synchronization is maintained. Hence, it represents a time delay that will result in a phase shift in the Transfer Function. This phase shift will be small given the fact that the frequency response of the Exciter/Generator is typically close to two decades below 120 Hz. For illustrative purposes, a typical Exciter field time constant is 80 msec and the frequency response of the exciter is 2 Hz, and the phase shift is 6 degrees at a generator's voltage output frequency of 60 Hz. (See Vleeshouvers Eindhoven University of Technology EUT report 92-D-258.)

Once phase lock on the generator output signal is obtained, the VCO will produce a voltage signal that will change linearly as a direct function of the frequency of the generator output voltage $V_{GEN}$. Hence, a Frequency to Voltage characteristic is achieved that can be readily utilized to produce a flexible Voltage to Hz control signal, as will now be discussed.

Volts per Hertz (V/Hz) control section: The PLL design shown in FIG. 9 exhibits a voltage to frequency conversion of 80 mV/Hz in the Vop signal output by the VCO of PLL circuit 410. The Vop signal that the PLL generates is an output voltage signal that is a linear function of the reference frequency. This frequency/voltage conversion property of Vop can be readily applied to obtain a control characteristic that maintains a constant Volts/Hz ratio in spite of frequency variations, thus avoiding saturation of the electromagnetic components of the load. Preferably, this characteristic has an adjustable start frequency (i.e. the maximum frequency at which the V/Hz starts) from a maximum of 60 Hz to a minimum that is the lowest frequency expected during overload conditions.

It is also useful to provide a flexible Volts/Hz capability that can be adjusted so as to best assist the recovery of the prime mover/exciter/generator combinations in the case of a heavy transient overload. For example, it is useful to provide the ability to adjust the V/Hz ratio from 1:1 to a higher value so that the output voltage will drop faster as the prime mover speed decreases as a result of a transient overload. Additionally, the flexible Volts/Hz control capability may provide the ability to control the frequency at which the V/Hz ratio begins to adjust at a predetermined frequency below 60 Hz (usually between 59.5 Hz to 57 Hz) so as to provide effective regulation for light to moderate load changes.

Figure 15:
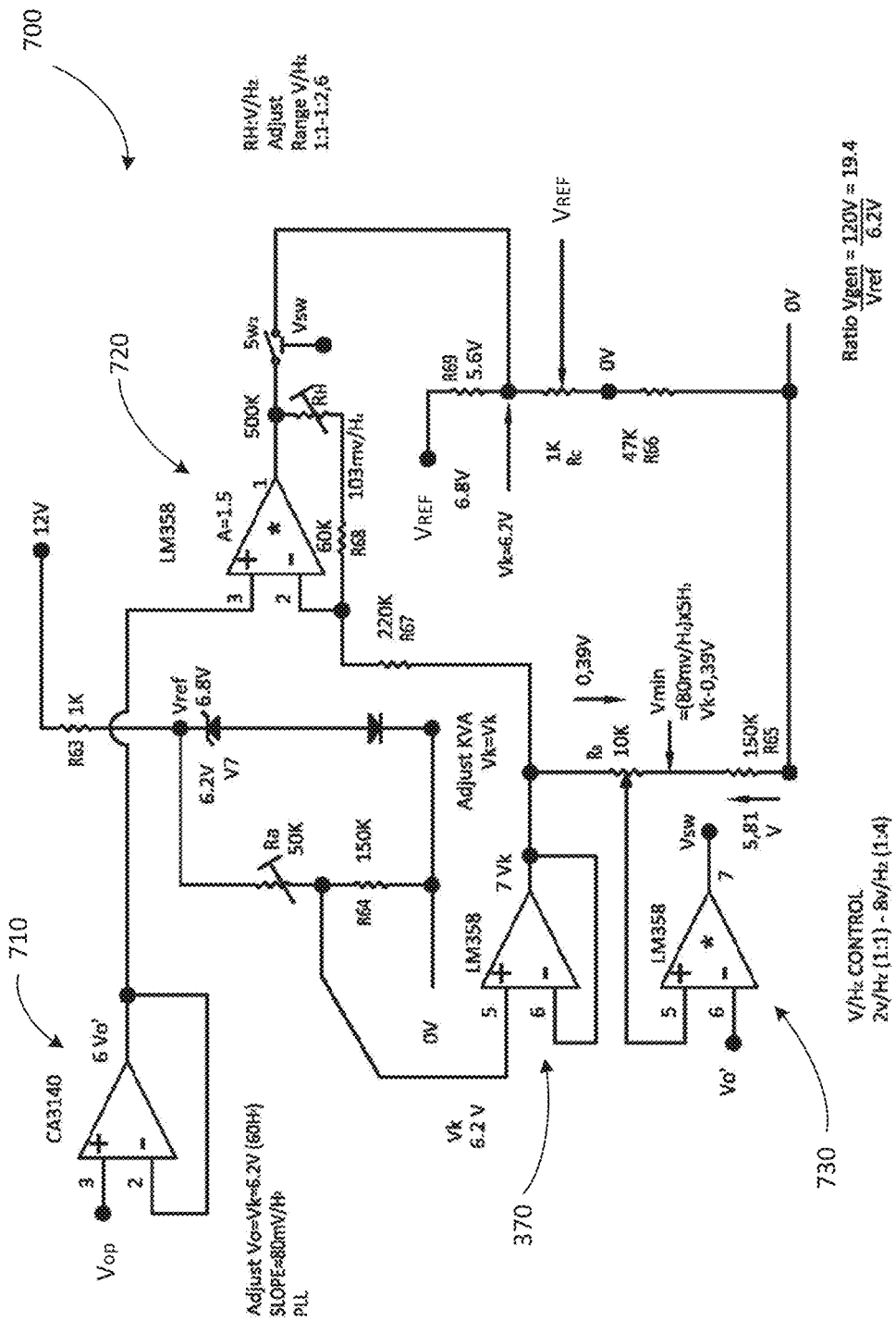
FIG. 15 is a circuit diagram illustrating an example of one embodiment of circuitry for the voltage to hertz control circuit shown in FIG. 7.

FIG. 15 is a circuit diagram illustrating one example of a voltage to hertz control circuit 700 in accordance with certain aspects of the present invention. PLL VCO input voltage Vop from PLL circuit 410 in FIG. 9, which is the filtered phase error signal output by the phase detector of PLL circuit 410, is input to a voltage follower amplifier 710, which is a CA 3140 high impedance operational amplifier in the example of FIG. 15 and which reduces the loading on the VCO output. The output Vo' of the voltage follower amplifier 710 is input to a voltage amplifier 720 with gain that is adjustable using variable resistor Rh. The signal input to voltage amplifier 720 is the difference between the output of the voltage follower LM358 730, which supplies a calibrated voltage Vk that is adjusted by variable resistor Ra, and the adjusted phase error output Vo' from voltage follower amplifier 710. Vk is a frequency reference voltage corresponding to a desired oscillating frequency that is fed into a voltage follower amplifier 730, in order to avoid loading the frequency reference voltage Vk, and produce a calibrated voltage reference. In the example shown, Vk is set to 6.2 V and the output of the VCO in PLL 410 of FIG. 9 is also adjusted to 6.2 V by variable resistor VRf. The circuit is thus calibrated to 60 HZ because the reference voltage Vk is the same as the VCO output voltage $V_{OP}$ so that the voltage at the input of voltage amplifier 720 is zero.

As the frequency of $V_{GEN}$ decreases, so does the voltage that is input to the voltage amplifier 720 and its output decreases the reference voltage fed to the control loop of FIG. 5, which decreases the output voltage $V_{GEN}$ of the generator. The sharpness or slope of the decrease is adjusted by adjusting resistor Rh. At Rh=0, the V/Hz ratio is 1:1. At Rh maximum, in this example, the ratio is 1:2.6. These values may be selected by design criteria to obtain the V/Hz ratio for the desired range of performance.

To adjust the frequency at which the V/Hz Characteristic is applied, a CMOS switch Sw2 is utilized at the output of amplifier 720. If switch Sw2 is disconnected, then the V/Hz functionality is disabled. When Sw2 is closed, the V/Hz control functionality will take effect with the V/Hz relationship determined by Rh, as explained above. The switch Sw2 is controlled by switching voltage signal Vsw that is the output of voltage follower amplifier 732, which is implemented as amplifier 730 in the same LM358 integrated circuit in the example shown, so that the section works as a voltage comparator. This comparator compares the VCO input voltage (Vo') with a voltage reference that is adjusted by a 10 K potentiometer. The potentiometer has an adjustment range of 0.4 V so that an adjustment range of 5 V is obtained with a V/Hz characteristic of 0.08 V/Hz. When V/Hz control circuit 700 is calibrated as described above, the V/Hz functionality can be controlled to engage at any selected frequency between 60 Hz and 55 Hz. Again, this range may be modified, but it is sufficient for a 60 Hz generator since it's unlikely that the frequency of output voltage $V_{GEN}$ will drop below 55 Hz under normal operating conditions. In this example, the voltage to hertz control circuit 700 provides a flexible V/Hz control functionality that may be adjusted from a ratio of 1:1 to 1:2.6. Circuit 700 can be configured to activate in at a selected frequency from 55-60 Hz. The 1:2.6 V/Hz selection combined with a sharp voltage drop per Hz assists the recovery of the frequency of the prime mover of the generator.

In this example, the circuit is implemented using standard CMOS integrated circuits for the digital portion, such as the quadrature generator circuit 400 of FIG. 9 and the sample and hold circuit 600 of FIG. 13. Analog circuitry is used to implement the V/Hz control circuit 700 of FIG. 15 using standard operational amplifiers. The DC modulator or chopper circuit 650 of FIG. 14 utilizes a LM3524D integrated circuit that is specifically designed for use in switching power supplies. The LM3524 circuit provides a linear characteristic for duty cycle modulation from 1% to 98% responsive to the $V_{DCMOD}$ voltage output from error amplifier circuit 550 of FIG. 12, where $V_{DCMOD}$ ranges from 1 volt to 3.5 volts. The control voltage range of 2.5 volts when the DC modulator circuit 650 has a duty cycle of 1 defines the gain of the DC modulator circuit 650. For example, a 160 volts maximum output with a 2.5 volts input range implies a gain of 64. In order to obtain a rapid transient response, this example utilizes the clean and fast responding detection signal to produce an error signal $V_{DCMOD}$ that is used to control an Insulated Gate Bipolar Transistor (IGBT) in the DC modulator circuit 650. The DC modulator circuit 650 operates at a frequency of approximately 1 Khz, which is well above the 60 Hz frequency of the power generator.

DC modulator circuit 650 utilizes linearly controlled Duty Cycle modulation in order to control the Field Current of field 240 in FIG. 7. This approach provides improved linearity compared to conventional SCR phase control techniques. Also, the higher DC modulator frequency combined with the fact that the voltage signal that is supplied is DC capacitor filtered voltage provides a much smoother field current. Further, the low noise detection signal minimizes jitter or blinking associated with no load or very light load conditions thus reducing damping requirements for addressing the jitter. The DC voltage supply obtained from a 120V AC full wave rectified and filtered AC voltage provides 160V DC, which may provide higher field current and, therefore, more field force as compared to a conventional full wave unfiltered supply. For example, a conventional 120 VAC full wave unfiltered supply, which is normally used with a SCR phase control based system, would supply 100V DC to the Exciter's field. The filter capacitor may be eliminated in some embodiments designed for higher power and/or voltage ratings that utilize a three phase full wave rectifier to feed the DC modulator.

In the power circuit 500 embodiment shown in FIG. 11, a relay with an initial delay may be used to feed an IGBT 540 in order to supply initial current to the field winding 530. An initializing circuit may be used in some embodiments to maintain the output voltage oscillating between around 130 to 135V AC until the PLL locks and takes control, which typically occurs in approximately 5 seconds. Once initialized, the generator supplies the voltage selected with the voltage adjustment control. Short circuit protection is provided for the IGBT 540 by a desaturation technique that may disconnect the IGBT in less than 8 µsec in case of a stiff short. The short circuit protection combined with a standard circuit breaker, e.g. a 5 A circuit breaker, generally provides adequate protection to the automatic voltage regulator circuit. The example shown in FIG. 11 is designed to supply up to 5 Amps continuous current at 40 degrees C. ambient temperature. The performance is generally limited by the capacity of a heatsink thermally coupled to the circuit. The power circuit 500 generally dissipates 4.5 W/Amp of output current.

The design as described above allows for self-starting based on residual magnetism with a minimum voltage of 4 VAC at the generator's output, which is a common requirement for emergency diesel driven generators. It is noteworthy that the starting relay is not required to handle high voltages or currents regardless of the current rating output of the AVR. Calibration upon construction and/or repair can typically be made with a four digit digital multi-meter with a 0.5% precision in DC voltage measurement, which facilitates device production. Instruments are generally not needed when an AVR is installed since only the output voltage and damping are typically adjusted.

As a result of the frequency synthesis technique of the present invention, the output of error amplifier sections 116 and 230 at steady state is essentially a constant 6.2 V DC voltage with no significant ripple in the examples discussed above. The duty cycle modulation control signal $V_{DCMOD}$ feeding the Duty cycle modulators 120 and 232 will also be an essentially constant average value, which leads to the field current provided to the field winding for the generator being constant and substantially ripple free.

Figure 20:
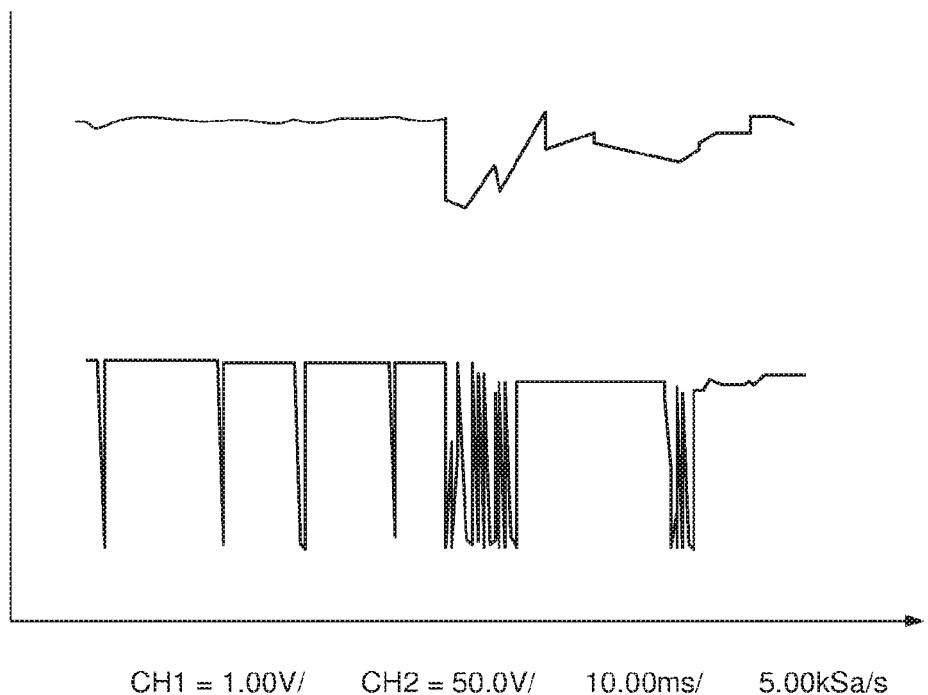
FIG. 20 is a photograph of an oscillogram illustrating a relationship between an error signal and a corresponding output signal from a chopper circuit in response to a transient load event in one example of an automatic voltage regulator.
Figure 21:
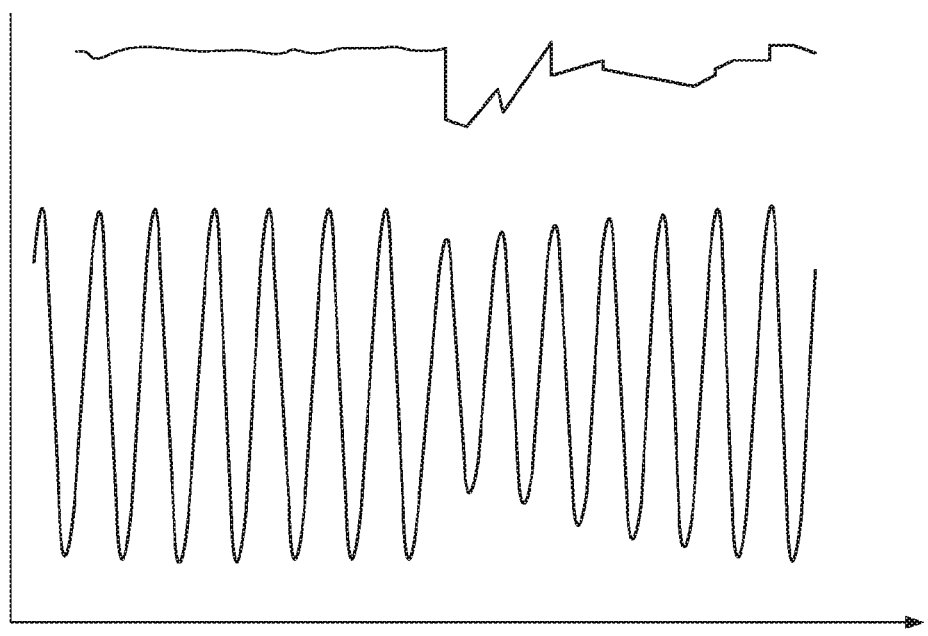
FIG. 21 is a photograph of an oscillogram illustrating a relationship between the error signal of FIG. 20 and an output voltage of a generator in response to the transient load event of FIG. 20 in one example of an automatic voltage regulator.

FIGS. 20 and 21 are oscillograms illustrating an example of transient response for a simulation in accordance with one example of the present invention when the load on the generator output jumps from 2% to 93% of maximum generator capacity. The upper trace of FIG. 20 represents the output at pin 6 of error amplifier 560 in FIG. 12, which is a relatively noise free and fast responding error signal. The lower trace is the output of the chopper circuit, such as the circuit of FIG. 15, which drives the field of the exciter. When the chopper output in the lower trace is low, then the full forcing voltage is being supplied to the field winding. When the chopper output is high, no excitation is being supplied to the field, which is then flywheeling. When the transient load increase occurs, the $V_{DCMOD}$ signal goes low and then returns to its steady state through a series of ramps, which causes the chopper output to apply several bursts of pulses to the field in order to increase the output of the generator in response to the transient thereby stabilizing the generator voltage. In the oscillogram of FIG. 20, the chopper response and field excitation occur with a delay of less than 1 msec based on the error signal.

FIG. 21 is an oscillogram comparing the $V_{DCMOD}$ error signal (top trace) to the generator output voltage $V_{GEN}$ (lower trace). In FIG. 21, the error signal has a delay of 8.3 msec or less and has low noise and the duty cycle of the field forcing is approximately 85% for the first 12 milliseconds of the transient of the error signal shown in FIG. 20. The exciter's field will be fully driven, e.g. 150 VDC, in less than 9.3 msec after occurrence of the transient. The fast, low noise response of the error signal combined with the high level of field forcing leads to a rapid, well damped response of the generator output voltage.

The embodiments discussed herein are directed to sampling a single phase of the output voltage $V_{GEN}$. If greatly unbalanced loads are expected, then other embodiments can be designed such that three phases are monitored and the resulting pulses combined at the Sample and Hold circuit. This entails no additional complexity since it is merely duplicating the line sampling and synchronization circuits three times. The sampling frequency for frequency synthesis is also tripled reducing the delay associated with voltage sensing in the outer proportional control loop to 2.8 msec, i.e. 8.3 msec divided by 3. The additional cost may be relatively modest since low cost, low power parts may be utilized.

Droop control may also be implemented at low cost in some embodiments by reducing the gain of the amplifier section, which increases the error signal in order to supply an incremental load and thus provide droop control. This may lead to a degradation of the regulation specification. Droop control that does not compromise regulation performance and is capable of improving the steady state regulation generally requires precise and fast measurement of the output current.

Embodiments of the AVR described above can be implemented that accurately detect the magnitude of the peak value of an AC sinusoidal variable signal and present it as a DC voltage level. By sampling the outputs of each phase through the use of current transformers, the load current can be monitored as a DC voltage level with speed and precision, which allows the load current to be closely monitored. The DC level signals thus produced will accurately represent the magnitude of the output current.

The DC level current control signals may be combined in a circuit that functions similarly to the Volts/Hz control circuit discussed above. However, while the slope is directly proportional for Volts/Hz control, i.e. the excitation drops as the frequency decreases, the slope is inversely proportional for Volts/Amps control, i.e. the excitation drops as the current increases, so the circuitry is modified accordingly. This will permit the current level at which the Droop control starts to be adjusted as well as the sharpness of the Droop control response as the current output increases. Sampling and representing the output current and output voltages as DC voltage levels allows for flexible control of the generator by adjusting the field excitation, which adjusts the $V_{ERROR}$ equation above for summer 152 by including the $V_{DROOP}$ output current control. The DC levels can be readily combined in the summer to provide a fast field excitation reduction when the predetermined current control limit is reached resulting in effective droop control. In stand-alone applications, the droop control can be adjusted so as to cancel the steady state 1% regulation drop by reversing the slope of the Volts/Amps characteristic as long as the output current rating of the generator is not exceeded.

It is noteworthy that A/D conversion of DC levels is very straightforward if microprocessor control is utilized in implementation of the AVR. Further optimization may be accomplished through microprocessor control using a look up table that includes specific data characterization, i.e time constants and Field Current versus Output current, of the specific synchronous generator and both the $V_{REF}$ and the damping constant Kd may be adjusted in such embodiments in order to efficiently control a given Prime Mover generator setup by the AVR.

Figure 22:
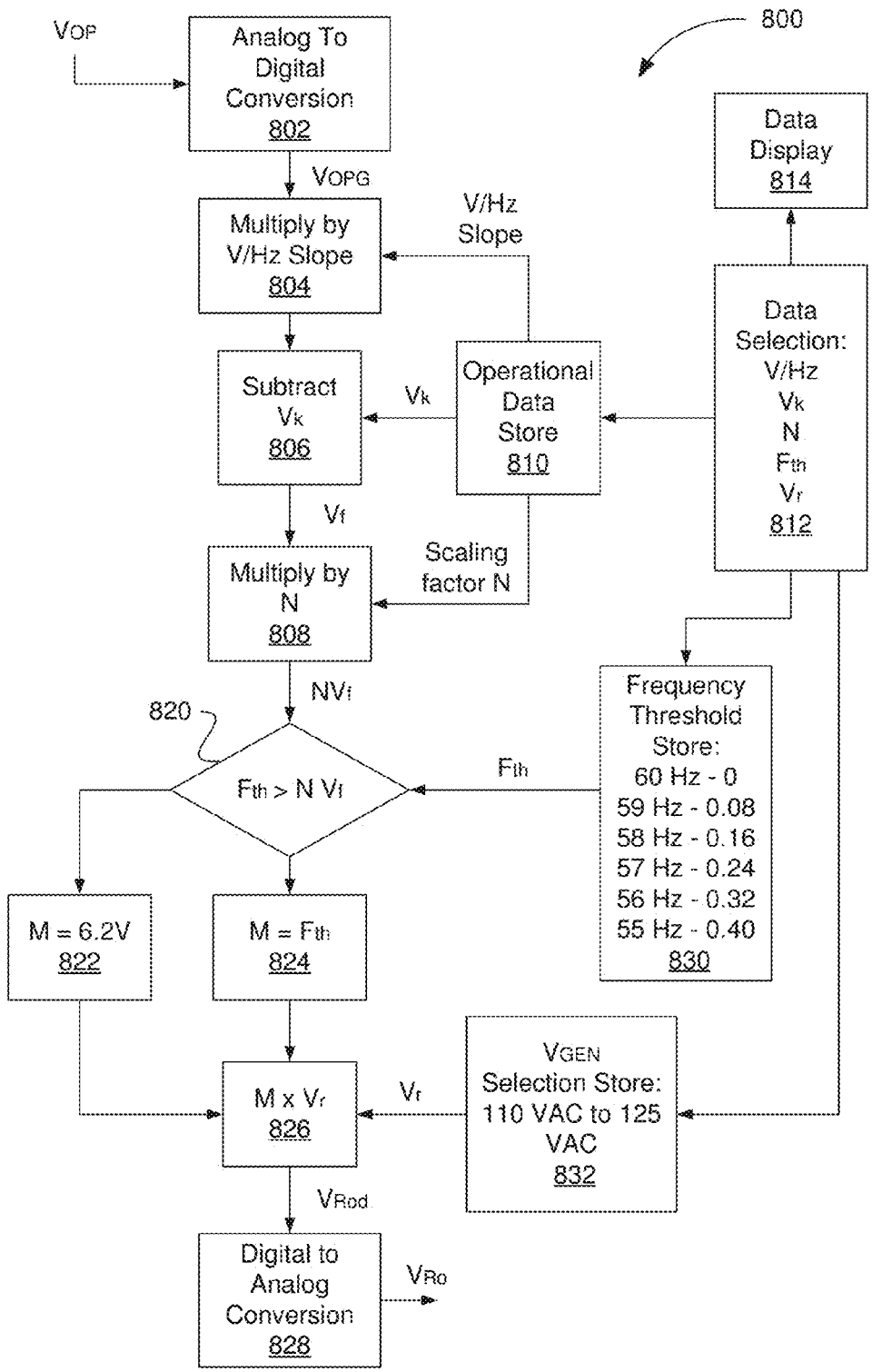
FIG. 22 is a control flow diagram illustrating the steps or stages of an exemplary process for voltage to hertz control that may be performed in a processor or similar device to implement a digital embodiment of another example of an automatic voltage regulator.
Figure 23:
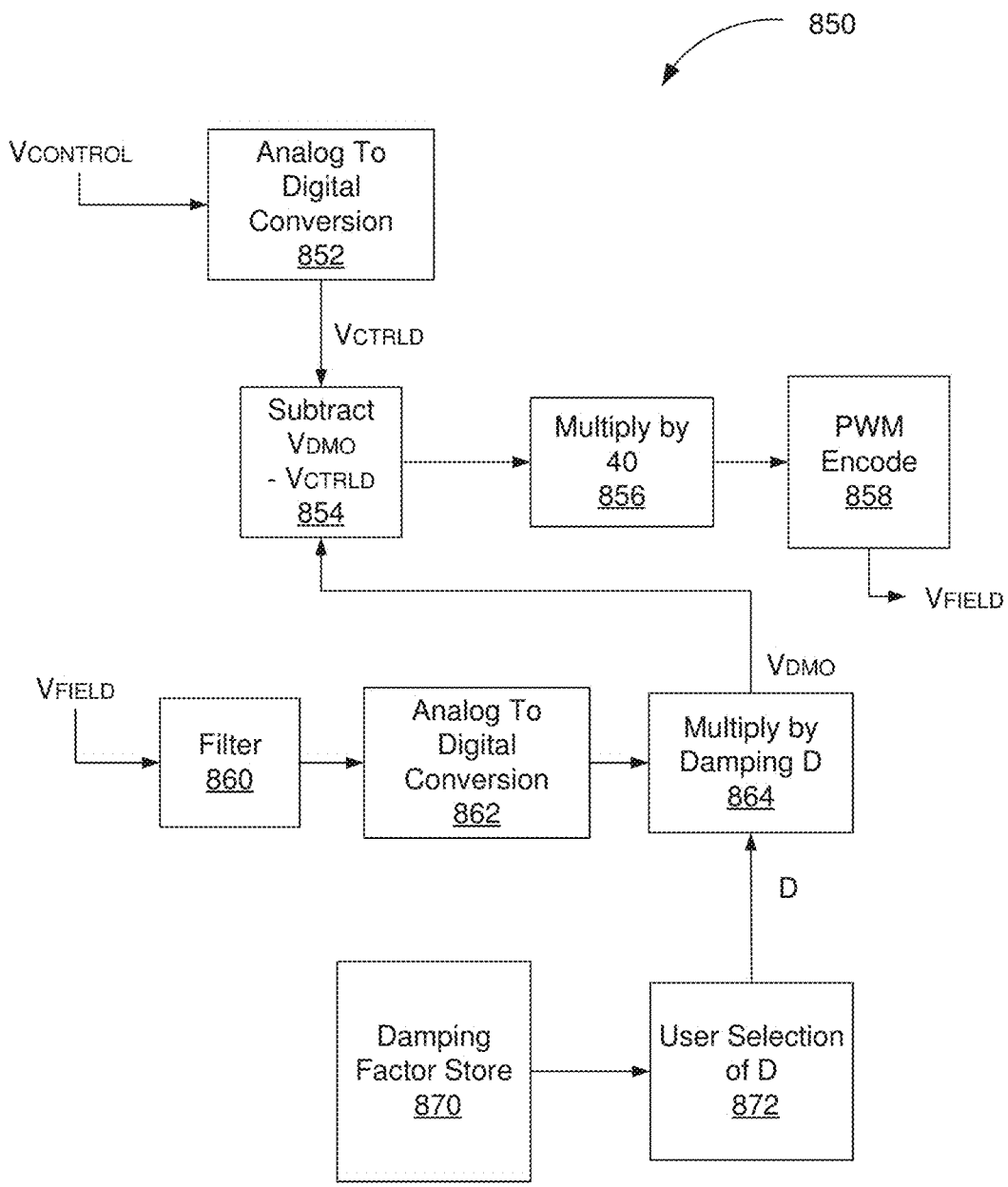
FIG. 23 is a control flow diagram illustrating the steps or stages of an exemplary process for that may be performed in a processor or similar device to digitally produce an error signal in a digital embodiment of another example of an automatic voltage regulator.

One of ordinary skill in the art will readily recognize that many aspects of the AVR described herein may be implemented using digital or microprocessor based technology. FIGS. 22 and 23 are control flow diagrams illustrating a microprocessor based implementation of the V/Hz control and error amplifier sections, respectively, discussed above with regard to FIGS. 12 and 15. The digital embodiments shown utilize persistent memory, such as read only memories (ROMs), to store operating data so that the data is preserved in the event. The memory may be implemented using modifiable memory, such as electrically erasable programmable read only memory (EEPROM), in order to provide an ability to modify and customize the operating data for a particular application or generator.

FIG. 22 shows an example of a voltage to Hz control function 800 implemented in a digital circuit that includes a computational device, e.g. a microcontroller or microprocessor, to implement the V/Hz section 224 of FIG. 7. FIG. 22 is a control flow diagram illustrating the steps or stages of an exemplary process for voltage to hertz control that may be performed in a digital embodiment of another example of an automatic voltage regulator.

Quadrature signal generator circuit 220 also outputs a voltage signal $V_{OP}$ from the PLL that is an error output voltage signal that effectively converts the phase difference between the $V_{LS}$ signal and the oscillating frequency of the PLL to a voltage signal that can be used by Voltage to Hertz control circuit 224 to control the frequency of the generator. Voltage to Hertz control circuit 224 utilizes the DC voltage signal $V_{OP}$ and utilizes the reference voltage signal $V_{REF}$ to produce a voltage to frequency control signal $V_{VH}$ that represents a phase correction needed to maintain $V_{GEN}$ at the desired frequency.

At step 802, voltage signal $V_{OP}$ from the PLL of quadrature signal generator circuit 220 is converted from analog to digital form. $V_{OP}$ is an error output voltage signal that effectively converts the phase difference between the $V_{LS}$ signal and the oscillating frequency of the PLL to a voltage signal that may be used to control the frequency of the generator. In one example, an analog to digital converter with ten bit resolution is utilized to accommodate an input range of 10 VDC, which provides an equivalent resolution of 0.12 Hz, with a sampling rate of 200 microseconds so as to avoid excessive delay. In this example, calibration of the PLL results in $V_{OP}$ being 6.2 V for a generator operating at a stable frequency of 60 Hz. In the example of FIG. 9, the sensitivity exhibited by the 4046 PLL circuit 410 is 80 mv/Hz. In order to achieve a 1:1 voltage to frequency ratio, $V_{OP}$ is scaled by 1.26 in this embodiment. The result of the analog to digital conversion and scaling is a corresponding digital value $V_{OPG}$.

V/Hz slope control is determined at step 804 by multiplying $V_{OPG}$ by a V/Hz slope parameter obtained from operational data store 810. In this example, the operation data parameters for the particular application are selected at step 812 through a user control input selection, which includes the V/Hz, Vk reference voltage, scaling factor N, threshold frequency Fth, and the generator output voltage selection Vr. The selections may be displayed at step 814.

For this example, the V/Hz parameter selected is 1.26 and Vk is 1.2. The result of steps 804 and 806 is $V_{OPG} \times 1.26-1.2$ to create Vf, which is scaled by N at step 808 to produce scaled frequency error signal NVf. The value of N is selected to determine the rate of the AVR's response. For example, the range for "N" may be from one to four. The V/Hz slope parameter, in this example, ranges from 1:1 to 2:26 V/Hz. Greater ranges may be provided in some implementations.

The frequency threshold Fth is also selected to determine the frequency at which the AVR begins to apply the selected V/Hz slope. In this example, the selectable range for Fth is from 60 to 55 Hz with the corresponding value for Fth stored in frequency threshold store 830 and the values for Fth vary from 0 to 0.4 depending on the desired threshold frequency. The value of variable NVf is compared with the selected value for Fth at step 820. If Fth is not greater than NVf, then the V/Hz slope is not applied and control branches to step 822, where the value of frequency control variable M is set to steady state reference value Vk, which corresponds to 6.2V in the present example for 60 Hz operation, such that no frequency adjustment is performed and control continues to step 826. If Fth is greater than NVf, then the frequency control variable M is set to the value of Fth in order to engage frequency control at the selected threshold frequency. In other examples, a similar approach may be applied to an over frequency at which frequency control is to terminate, e.g. 65 Hz.

At step 826, the value of M determined above is multiplied by the output voltage level parameter Vr, which defines the selected generator output voltage. For example, ten values may be stored in the $V_{GEN}$ selection store 832, e.g. a ROM or EEPROM, to permit the generator's output voltage to be selected from 110 VAC to 125 VAC in ten increments. A voltmeter showing the generators output voltage through a digital display may also be included in some embodiments of an AVR.

The result from multiplying M×Vr at step 826 is digital frequency control signal $V_{VHD}$, which is converted from a digital to analog value at 828 in order to produce frequency control signal $V_{VH}$, which is output to an error amplifier, such as the error amplifier shown in FIG. 12, as the analog signal that is input to a potentiometer that control the generator's output voltage in the analog version shown. However, if the error amplifier function is implemented digitally, as shown in FIG. 23, then the voltage of the generator's output is controlled by selecting a given Vr value as explained above.

Note that, in some embodiments, it is possible to implement the PLL using a number controlled oscillator (NCO) and digital filtering in place of a VCO. Sampling rates will need to be high enough to ensure low noise and jitter due to quantization error. The clock frequency used should be high enough to accommodate computation of the frequency synthesis process with a delay of less than about 3 degrees at an operating frequency of 60 Hz.

FIG. 23 is a control flow diagram illustrating the steps or stages of an exemplary process 850 that may be performed in a digital circuit that includes a processor or similar device to digitally produce an error signal in a digital embodiment of another example of an automatic voltage regulator. In this example, the analog DC voltage level control signal $V_{CONTROL}$ output from the Sample and Hold circuit 600 of FIG. 13 is converted to a digital equivalent value at step 852 to produce $V_{CTRLD}$.

Note that the circuits that generate $V_{CONTROL}$ are a mixture of digital and analog. The frequency synthesis and synchronization circuits as well as the Sample and Hold circuit are digital, but the output $V_{CONTROL}$ is a DC voltage level that represents the magnitude of the generator's output voltage. In this example, the analog to digital conversion has ten bit resolution and a sampling speed of 200 microseconds. Longer sampling times will degrade the transient performance of the regulator. To reduce response time, separate microcontrollers may be utilized for the Error Amplifier and the V/Hz control process 800 of FIG. 22 in order to perform these processes in parallel and reduce execution time, though execution may need to be synchronized. The speed issue may become important because a typical encoding algorithm for the Pulse Width Modulation (PWM) operates at 1 Khz with a Duty Cycle ranging from 1% to 100% and time intervals as short as 10 microseconds may need to be accommodated.

The $V_{FIELD}$ signal from the DC modulator circuit 650 of FIG. 14 is received and filtered at step 860. The filtering step may involve a potential divider circuit and a low pass filter with a zener diode included for protection purposes. The filtering may also involve a 1 Microfarad capacitor and 120 K resistor that provide a derivative action. The analog to digital conversion performed at step 862 involves high input impedance, in one example, in order to reduce the effect on the derivative action of the filter step 860. The input filtering and dividing function of step 860 is configured to provide an output equivalent to the lowest setting of the damping adjustment control in the analog error amplifier circuit of FIG. 12. Further, the filtering functionality of step 860 is selection to have time constants that are electrically equivalent to the V/Hz control circuit 700 of FIG. 15.

At step 864, the conditioned and digitized $V_{FIELD}$ signal is multiplied by a damping factor D selected from damping factor store 870 by a user selection at step 872. The damping factor is selected by a user as needed to compensate for loop stability and load disturbances. In one example, ten values for D ranging from 1 to 31.6 in ten evenly spaced increments are stored in a ROM and selected by the user by a control, such as up down pushbuttons, with a display that indicates the value selected, i.e. D=10 means multiply by 31.6. The result of the multiplication at step 864 is digital damping signal $V_{DMO}$.

At step 854, $V_{CTRLD}$ is subtracted from $V_{DMO}$ and the result multiplied by a predetermined Gain value at step 856, in this example, where a Gain value of 40 is used, which is equivalent to the combined gain of the amplifiers in error amplifier circuit of FIG. 15. The output of gain block 856 is then PWM encoded at step 858 to produce the $V_{DCMOD}$ signal that is output to a duty cycle modulator, such as duty cycle modulator circuit 232, which, in turn, drives the power section 234 in order to generate the field current $I_{FIELD}$ for the field winding.

Figure 24:
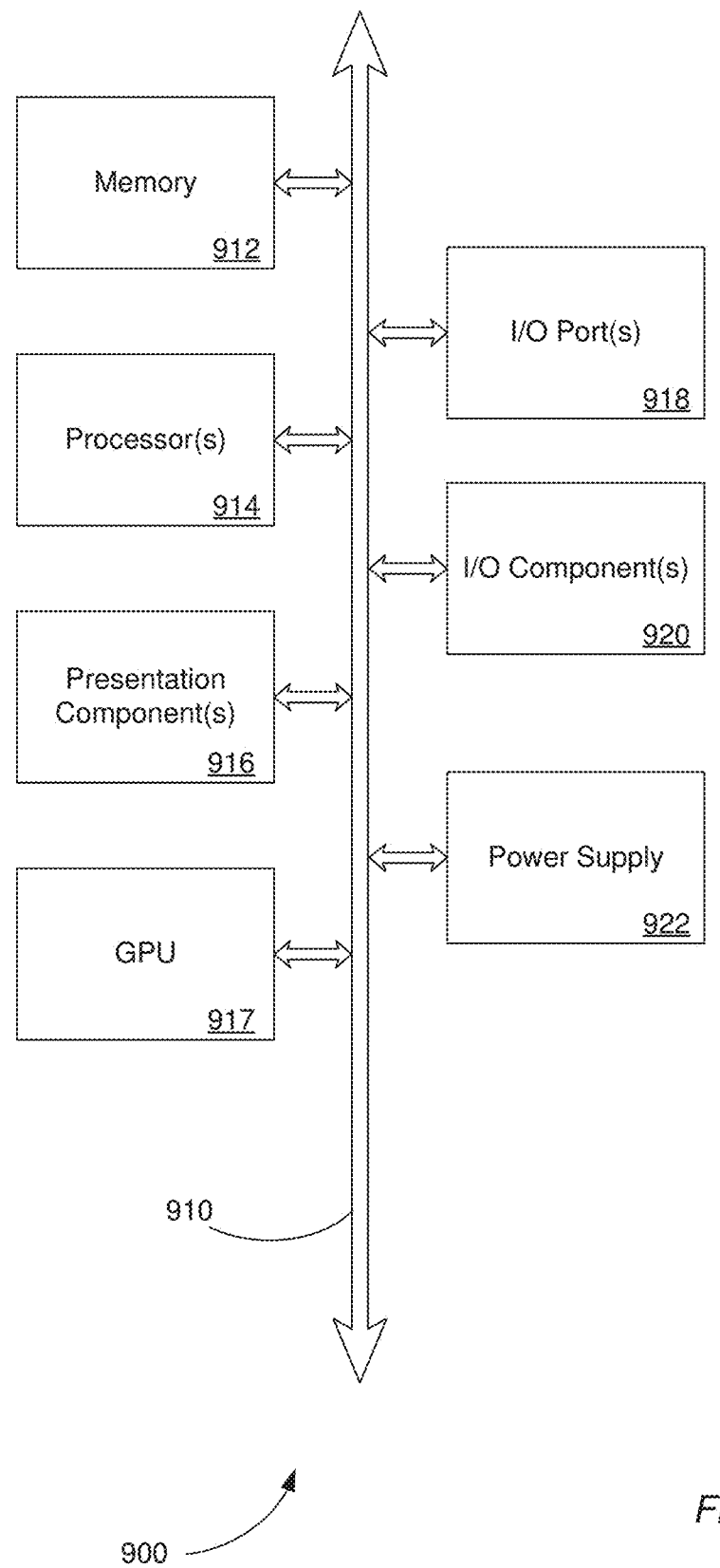
FIG. 24 is a functional block diagram illustrating an example of a computer system suitable for some aspects of embodiments of an automatic voltage regulator.

FIG. 24 depicts a computing device 900 that includes a bus 910 that may directly or indirectly couple all or some of the following devices: memory 912, one or more processors 914, one or more presentation components 916, input/output ports 918, one or more graphics processing units (GPUs) 917, input/output components 920, and an illustrative power supply 922. The bus 910 represents what may be one or more busses (such as an address bus, data bus, or combination thereof).

Although the various blocks of FIG. 24 are shown with lines for the sake of clarity, in reality, delineating various components is not so clear, and metaphorically, the lines would be more accurately be grey and fuzzy. For example, one may consider a presentation component such as a display device to be an I/O component. Also, processors have memory. In addition, GPUs can have their own internal busses and independent memory to the main system memory. Not all of the components shown in FIG. 24 are needed to implement certain aspects of the present invention. For example, if no display is implemented, then the presentation components 916 and GPU 917 may not be needed. Likewise, if no input/output functionality is implemented, then components 918 and 920 may not be needed. Power supply 922 may be the same supply utilized to support the analog components. And many of the components shown may be combined in microcontroller devices, which are suitable for certain embodiments of certain aspects of the present invention. One of ordinary skill in the art will readily recognize that a wide variety of devices and systems having processing capability may be utilized in certain embodiments without departing from the scope of the present invention.

The computing device 900 typically includes or can operate with a variety of computer-readable media. By way of example, computer-readable media may includes Random Access Memory ("RAM"); Read Only Memory ("ROM"); Electronically Erasable Programmable Read Only Memory ("EEPROM"); flash memory or other memory technologies; Compact Disc Read-Only Memory ("CDROM"), Digital Versatile Disks ("DVD") or other optical or holographic media; magnetic cassettes, magnetic tape, magnetic disk storage or other magnetic storage devices, or any other medium that can be used to encode and persistently store desired information for a sufficient duration of time to allow the information to be accessed by computing device 900 for use in certain embodiments.

The memory 912 includes computer-readable media in the form of volatile and/or nonvolatile memory. The memory 912 may be removable, non-removable, or a combination thereof. Exemplary hardware devices include solid-state memory, hard drives, optical-disc drives, etc. The computing device 900 includes one or more processors that read data from various entities such as the memory 912 or I/O components 920. Presentation component(s) 916 present data indications to a user or other device. Exemplary presentation components 916 include a display device, speaker, printing component, vibrating component, etc.

The GPU 917 is typically dedicated to processing and rendering data related to graphics, but can be manipulated to process other data and command types. GPUs 917 are often integrated into, or installed on a presentation component 916, such as a video card, or are integrated into, or installed on a motherboard, main circuit board, or logic board of the computing device 900. In an embodiment, the central processing unit, ("CPU") provides the functions of a GPU 917 for the computing device 900. I/O ports 918 allow the computing device 900 to be logically coupled to other devices including I/O components 920, some of which may be built in.

Note that in the analog example discussed above, output scaling was done to accommodate the LM3424D circuit 660 of the Duty Cycle modulator circuit 650 of FIG. 14, which has an input range of 1 to 3.5 Volts in order to obtain duty cycle control from 1% to 100%. In one example, the PWM encoding function 858 has to emulate the performance of the LM3424D. Alternatively, the input signal to PWM block 858 may be fed to a digital to analog converter to convert it an analog voltage signal that may be input to an LM3424D circuit.

Embodiments of an AVR as discussed herein may be implemented digitally. Digitization may also provide a means to display the values of the key variables under control, such as V/Hz slope, voltage threshold, damping, and output voltage. It may also provide for adjustment of these variables via a user interface, such as up down pushbutton functionality or graphical user interface control, which may be readily implemented by well-known user interface functionality. A digital implementation may also facilitate remote digital control of the AVR and display of operating parameters and data of a remote AVR.

The examples above demonstrate that a frequency synthesis approach to automatic voltage regulation combined with sample and hold circuitry can effectively capture and convert a peak value of an AC sinusoidal generator output voltage to an accurate DC voltage control with a response time of one half of the period of the frequency of the generator output signal being measured and regulated. This approach produces a responsive, low-noise and precise error signal for a proportional control loop of an AVR. By using an IGBT or PMOS switch chopper, the time constants of the AVR and the time delay in signal detection may be significantly reduced, e.g. by a factor of 10 to 40 times, below the time constants typically associated with conventional synchronous generators. Significant improvements in responsiveness and precision control in transient response may be achieved while maintaining stability and steady state regulation, e.g. approximately 1% no load to full load. Additionally, the frequency versus Hz linear characteristic readily available from the frequency synthesis approach lends itself to use as an effective and flexible implementation of a Volts/Hz control characteristic for handling heavy transient loads in stand-alone generator operation. By monitoring the output currents using frequency synthesis, e.g. converting the peak values of the output currents to DC voltage levels, an adjustable droop control may be added to facilitate parallel generator operation as part of a power system.

It will be understood by one of ordinary skill in the art that, while the embodiments of the invention described herein are generally designed for 60 Hz at 120 VAC line to ground and 208 VAC line to line voltage generator output, the invention can also be applied to operate at 50 Hz with minor recalibration. Different voltages may be obtained by changing transformer primary voltage ratings. Additionally a selector switch may be added to select between 60 Hz and 50 Hz. A wide range of embodiments of the invention maybe be implemented utilizing the power ratings of modern Power Semiconductors and of transformer selection for different voltages (i.e. 120, 208, 440) VAC.

It should also be understood that the present invention as described above can be implemented in the form of control logic using computer software in a modular or integrated manner. Based on the disclosure and teachings provided herein, a person of ordinary skill in the art will know and appreciate other ways and/or methods to implement the present invention using hardware and a combination of hardware and software.

Any of the software components, processes or functions described in this application may be implemented as software code to be executed by a processor using any suitable computer language such as, for example, Java, C++ or Perl or using, for example, conventional or object-oriented techniques. The software code may be stored as a series of instructions, or commands on a computer readable medium, such as a random access memory (RAM), a read only memory (ROM), a magnetic medium such as a hard-drive or a floppy disk, or an optical medium such as a CD-ROM. Any such computer readable medium may reside on or within a single computational apparatus, and may be present on or within different computational apparatuses within a system or network.

All references, including publications, patent applications, and patents, cited herein are hereby incorporated by reference to the same extent as if each reference were individually and specifically indicated to be incorporated by reference and/or were set forth in its entirety herein.

The use of the terms "a" and "an" and "the" and similar referents in the specification and in the following claims are to be construed to cover both the singular and the plural, unless otherwise indicated herein or clearly contradicted by context. The terms "having," "including," "containing" and similar referents in the specification and in the following claims are to be construed as open-ended terms (e.g., meaning "including, but not limited to,") unless otherwise noted.

Recitation of ranges of values herein are merely indented to serve as a shorthand method of referring individually to each separate value inclusively falling within the range, unless otherwise indicated herein, and each separate value is incorporated into the specification as if it were individually recited herein. All methods described herein can be performed in any suitable order unless otherwise indicated herein or clearly contradicted by context. The use of any and all examples, or exemplary language (e.g., "such as") provided herein, is intended merely to better illuminate embodiments of the invention and does not pose a limitation to the scope of the invention unless otherwise claimed. No language in the specification should be construed as indicating any non-claimed element as essential to each embodiment of the present invention.

Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the invention.

What is claimed is:

1. An automatic voltage regulator circuit, the circuit comprising:
   a direct current power supply circuit configured to receive a power signal to be regulated and, responsive thereto, full wave rectify the received power signal and generate a DC reference voltage signal, where a voltage level of the DC reference voltage corresponds to a desired steady state operating voltage level for the power signal;
   a line sampling circuit configured to receive the power signal and compare the power signal to the DC reference voltage signal in order to generate a line sync signal synchronized to an oscillation frequency of the power signal;
   a quadrature signal generator circuit configured to receive the line sync signal and produce first and second phase signals that are synchronized to the line sync signal and 90° out of phase with one another, where the quadrature signal generator circuit includes a phase locked loop circuit configured to lock onto the frequency of the line sync signal using a lock frequency that is at least twice the oscillation frequency of the power signal, where the phase locked loop circuit is configured to output a phase error signal that corresponds to a phase difference between the line sync signal and an oscillating frequency of the phase locked loop;
   a quadrature sync circuit configured to receive the first and second phase signals and, responsive thereto, generate a quadrature signal that is in quadrature with the line sync signal;
   a sample and hold circuit configured to receive the quadrature signal and the full wave rectified power signal and responsive thereto, sample the peak voltages of the full wave rectified power signal using the quadrature signal and hold the sampled peak voltages to produce a voltage level control signal representing a current absolute magnitude of the amplitude of the power signal;
   an error amplifier configured to receive the reference voltage, the voltage level control signal, and a damping signal, where the error amplifier circuit is further configured to subtract the error signal and the damping signal from the reference voltage in order to produce a duty cycle modulation signal;
   a duty cycle modulator circuit configured to receive the duty cycle modulation signal and, responsive thereto, produce a field voltage control signal, where the field voltage control signal oscillates at a predetermined frequency with a duty cycle controlled by the duty cycle modulation signal;
   a stabilizer circuit configured to receive the field voltage control signal and, responsive thereto, low-pass filter the field voltage control signal in order to produce the damping signal; and
   a short circuit detection circuit configured to monitor the voltage level control signal and, if the voltage level control signal representing the current absolute magnitude exceeds a DC tripping threshold level, engage a circuit protection device.

2. An automatic voltage regulator circuit, the circuit comprising:
   a direct current power supply circuit configured to receive a power signal of a first power generator to be regulated and, responsive thereto, full wave rectify the received power signal and receive a DC reference voltage signal representing a voltage output of a second power generator where the first generator is desired to operate in synchronization with the second power generator;
   a line sampling circuit configured to receive the power signal and compare the power signal to the DC reference voltage signal in order to generate a line sync signal synchronized to an oscillation frequency of the power signal;
   a quadrature signal generator circuit configured to receive the line sync signal and produce first and second phase signals that are synchronized to the line sync signal and 90° out of phase with one another, where the quadrature signal generator circuit includes a phase locked loop circuit configured to lock onto the frequency of the line sync signal using a lock frequency that is at least twice the oscillation frequency of the power signal, where the phase locked loop circuit is configured to output a phase error signal that corresponds to a phase difference between the line sync signal and an oscillating frequency of the phase locked loop;
   a quadrature sync circuit configured to receive the first and second phase signals and, responsive thereto, generate a quadrature signal that is in quadrature with the line sync signal;
   a sample and hold circuit configured to receive the quadrature signal and the full wave rectified power signal and responsive thereto, sample the peak voltages of the full wave rectified power signal using the quadrature signal and hold the sampled peak voltages to produce a voltage level control signal representing a current absolute magnitude of the amplitude of the power signal;
   an error amplifier configured to receive the reference voltage, the voltage level control signal, and a damping signal, where the error amplifier circuit is further configured to subtract the error signal and the damping signal from the reference voltage in order to produce a duty cycle modulation signal;
   a duty cycle modulator circuit configured to receive the duty cycle modulation signal and, responsive thereto, produce a field voltage control signal, where the field voltage control signal oscillates at a predetermined frequency with a duty cycle controlled by the duty cycle modulation signal; and a stabilizer circuit configured to receive the field voltage control signal and, responsive thereto, low-pass filter the field voltage control signal in order to produce the damping signal.

\* \* \* \* \*